US009793137B2

(12) United States Patent
Somervell et al.

(10) Patent No.: US 9,793,137 B2
(45) Date of Patent: Oct. 17, 2017

(54) USE OF GRAPHO-EPITAXIAL DIRECTED SELF-ASSEMBLY APPLICATIONS TO PRECISELY CUT LOGIC LINES

(71) Applicant: Tokyo Electron Limited, Tokyo (JP)

(72) Inventors: Mark H. Somervell, Austin, TX (US); Benjamen M. Rathsack, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 15/230,974

(22) Filed: Aug. 8, 2016

(65) Prior Publication Data

US 2016/0343588 A1  Nov. 24, 2016

Related U.S. Application Data

(63) Continuation-in-part of application No. 14/518,548, filed on Oct. 20, 2014, now Pat. No. 9,412,611.
(Continued)

(51) Int. Cl.
*H01L 21/302* (2006.01)
*H01L 21/3213* (2006.01)
(Continued)

(52) U.S. Cl.
CPC ...... *H01L 21/32139* (2013.01); *G03F 7/0002* (2013.01); *G03F 7/091* (2013.01);
(Continued)

(58) Field of Classification Search
CPC ......... G08F 7/09; G08F 7/094; G03F 7/0002; G03F 7/091; H01L 21/0273;
(Continued)

(56) References Cited

U.S. PATENT DOCUMENTS 5,344,742 A   9/1994   Sinta et al.
5,650,261 A   7/1997   Winkle
(Continued)

FOREIGN PATENT DOCUMENTS

CN   101681812 A   3/2010
CN   103187245 A   7/2013
(Continued)

OTHER PUBLICATIONS

International Searching Authority, Search Report and Written Opinion issued in corresponding International Application No. PCT/US14/61396, dated Jan. 21, 2015, 9 pages.
(Continued)

*Primary Examiner* — Lan Vinh
(74) *Attorney, Agent, or Firm* — Wood Herron & Evans LLP

(57) ABSTRACT

A method for patterning topography is provided. A substrate is provided with a plurality of lines. The method includes aligning and preparing a first directed self-assembly (DSA) pattern overlying the lines, transferring the first pattern to form first line cuts, aligning and preparing a second DSA pattern overlying the lines, and transferring the second pattern to form second line cuts. The DSA patterns include trenches and holes of diameter d, and each comprise a block copolymer having HCP morphology, a characteristic dimension $L_o$ approximately equal to the line pitch, and a minority phase of the diameter d. The trenches are wet by a majority phase of the block copolymer and guide formation of the holes. The aligning and preparation of the DSA patterns include overlapping the two sets of trenches such that areas between holes of one pattern and adjacent holes of the other pattern are shared by adjacent trenches.

18 Claims, 17 Drawing Sheets

Related U.S. Application Data

(60) Provisional application No. 61/893,277, filed on Oct. 20, 2013.

(51) Int. Cl.
    *H01L 21/308*     (2006.01)
    *H01L 21/027*     (2006.01)
    *H01L 21/033*     (2006.01)
    *G03F 7/00*     (2006.01)
    *G03F 7/09*     (2006.01)

(52) U.S. Cl.
    CPC ...... *H01L 21/0273* (2013.01); *H01L 21/0335* (2013.01); *H01L 21/0337* (2013.01); *H01L 21/0338* (2013.01); *H01L 21/3081* (2013.01); *H01L 21/3086* (2013.01); *H01L 21/3088* (2013.01)

(58) Field of Classification Search
    CPC ............. H01L 21/0335; H01L 21/0337; H01L 21/0338; H01L 21/3081; H01L 21/3086; H01L 21/3088; H01L 21/32139; H01L 21/31144; H01L 21/31116
    USPC ....... 438/706, 710, 712, 717, 723, 725, 736; 430/310, 312, 313
    See application file for complete search history.

(56) References Cited

U.S. PATENT DOCUMENTS

| | | |
|---|---|---|
| 5,709,754 A | 1/1998 | Morinville et al. |
| 5,830,608 A | 11/1998 | Ishiwata et al. |
| 6,303,477 B1 | 10/2001 | Ianovitch |
| 6,312,971 B1 | 11/2001 | Amundson et al. |
| 6,846,748 B2 | 1/2005 | Chien et al. |
| 6,855,476 B2 | 2/2005 | Ferreira et al. |
| 7,521,094 B1 | 4/2009 | Cheng et al. |
| 7,579,278 B2 | 8/2009 | Sandhu |
| 7,687,220 B2 | 3/2010 | Yamato et al. |
| 7,723,009 B2 | 5/2010 | Sandhu et al. |
| 7,754,518 B2 | 7/2010 | Koelmel et al. |
| 7,811,940 B2 | 10/2010 | Sandhu |
| 7,923,373 B2 | 4/2011 | Sandhu |
| 8,039,196 B2 | 10/2011 | Kim et al. |
| 8,083,953 B2 | 12/2011 | Millward et al. |
| 8,241,822 B2 | 8/2012 | Yamato et al. |
| 8,277,564 B2 | 10/2012 | Le et al. |
| 8,333,522 B2 | 12/2012 | Arima et al. |
| 8,420,304 B2 | 4/2013 | Inatomi |
| 8,603,867 B2 | 12/2013 | Kim et al. |
| 8,790,522 B1 | 7/2014 | Schmid et al. |
| 8,853,085 B1 | 10/2014 | Abdallah et al. |
| 8,900,467 B1 | 12/2014 | Chapuis et al. |
| 8,986,554 B2 | 3/2015 | Kim et al. |
| 9,005,877 B2 | 4/2015 | Rathsack et al. |
| 9,034,197 B2 | 5/2015 | Lille et al. |
| 9,190,288 B2 | 11/2015 | Tanaka et al. |
| 9,339,312 B2 | 5/2016 | Doherty et al. |
| 9,412,611 B2 | 8/2016 | Somervell et al. |
| 9,418,860 B2 | 8/2016 | Somervell et al. |
| 2002/0192619 A1 | 12/2002 | Besek |
| 2002/0193619 A1 | 12/2002 | Crivello et al. |
| 2003/0004075 A1 | 1/2003 | Suto et al. |
| 2003/0084925 A1 | 5/2003 | Nakajima et al. |
| 2003/0227090 A1 | 12/2003 | Okabe |
| 2005/0056219 A1 | 3/2005 | Dip et al. |
| 2005/0215713 A1 | 9/2005 | Hessell et al. |
| 2005/0229427 A1 | 10/2005 | Sugimoto et al. |
| 2006/0123658 A1 | 6/2006 | Izumi |
| 2006/0251989 A1 | 11/2006 | Breyta et al. |
| 2007/0037412 A1 | 2/2007 | Dip et al. |
| 2007/0155132 A1 | 7/2007 | Ancilotti et al. |
| 2007/0184656 A1 | 8/2007 | Sherman et al. |
| 2007/0224823 A1 | 9/2007 | Sandhu |
| 2007/0237697 A1 | 10/2007 | Clark |
| 2007/0238028 A1 | 10/2007 | Inatomi |
| 2008/0032490 A1 | 2/2008 | Tuominen et al. |
| 2008/0193658 A1 | 8/2008 | Millward |
| 2008/0311402 A1 | 12/2008 | Jung et al. |
| 2008/0318005 A1 | 12/2008 | Millward |
| 2009/0081827 A1 | 3/2009 | Yang et al. |
| 2009/0087664 A1 | 4/2009 | Nealey et al. |
| 2009/0181171 A1 | 7/2009 | Cheng et al. |
| 2009/0200646 A1 | 8/2009 | Millward et al. |
| 2009/0215272 A1 | 8/2009 | Sadjadi et al. |
| 2009/0236309 A1 | 9/2009 | Millward et al. |
| 2009/0291398 A1 | 11/2009 | Horiuchi |
| 2010/0055621 A1 | 3/2010 | Hatakeyama et al. |
| 2010/0159214 A1 | 6/2010 | Hasegawa et al. |
| 2010/0178615 A1 | 7/2010 | Colburn et al. |
| 2010/0193898 A1 | 8/2010 | Hautala et al. |
| 2010/0200774 A1 | 8/2010 | Burke et al. |
| 2010/0227276 A1 | 9/2010 | Mizuno |
| 2010/0279062 A1 | 11/2010 | Millward et al. |
| 2011/0033786 A1 | 2/2011 | Sandhu |
| 2011/0039413 A1 | 2/2011 | Akinmade-Yusuff et al. |
| 2011/0059299 A1 | 3/2011 | Kim et al. |
| 2011/0147965 A1 | 6/2011 | Mistry et al. |
| 2011/0147984 A1 | 6/2011 | Cheng et al. |
| 2011/0147985 A1 | 6/2011 | Cheng et al. |
| 2011/0151382 A1 | 6/2011 | Kim et al. |
| 2011/0186544 A1 | 8/2011 | Endou et al. |
| 2011/0206905 A1 | 8/2011 | Buriak et al. |
| 2011/0229120 A1 | 9/2011 | Takaki et al. |
| 2011/0232677 A1 | 9/2011 | Liu et al. |
| 2011/0272381 A1 | 11/2011 | Millward et al. |
| 2012/0003587 A1 | 1/2012 | Kim et al. |
| 2012/0031892 A1 | 2/2012 | Shigetomi et al. |
| 2012/0046415 A1 | 2/2012 | Millward et al. |
| 2012/0046421 A1 | 2/2012 | Darling et al. |
| 2012/0067843 A1 | 3/2012 | Watanabe et al. |
| 2012/0077127 A1 | 3/2012 | Sills et al. |
| 2012/0088192 A1 | 4/2012 | Trefonas et al. |
| 2012/0141741 A1* | 6/2012 | Millward ................. B05D 1/34 428/173 |
| 2012/0202017 A1* | 8/2012 | Nealey ................. B81C 1/00031 428/195.1 |
| 2012/0207940 A1 | 8/2012 | Muramatsu et al. |
| 2012/0223053 A1 | 9/2012 | Millward et al. |
| 2012/0312501 A1 | 12/2012 | Koole et al. |
| 2013/0099362 A1 | 4/2013 | Kim et al. |
| 2013/0143406 A1 | 6/2013 | Hsu et al. |
| 2013/0183827 A1 | 7/2013 | Millward |
| 2013/0189504 A1 | 7/2013 | Nealey et al. |
| 2013/0273330 A1 | 10/2013 | Wang et al. |
| 2013/0292805 A1 | 11/2013 | Cai et al. |
| 2013/0344249 A1 | 12/2013 | Minegishi et al. |
| 2014/0061154 A1 | 3/2014 | Kim et al. |
| 2014/0065839 A1 | 3/2014 | Kawanishi et al. |
| 2014/0099583 A1 | 4/2014 | Holmes et al. |
| 2014/0116980 A1 | 5/2014 | Wuister |
| 2014/0127910 A1 | 5/2014 | Hieno et al. |
| 2014/0154630 A1 | 6/2014 | Schmid et al. |
| 2014/0256145 A1 | 9/2014 | Abdallah et al. |
| 2014/0287083 A1* | 9/2014 | Gao ..................... G03F 7/0035 425/385 |
| 2014/0315390 A1 | 10/2014 | Abdallah et al. |
| 2015/0021295 A1 | 1/2015 | Yoshikawa et al. |
| 2015/0108087 A1 | 4/2015 | Somervell et al. |
| 2015/0111387 A1 | 4/2015 | Somervell et al. |
| 2015/0126034 A1 | 5/2015 | Latypov et al. |
| 2015/0191034 A1 | 7/2015 | Millward et al. |

FOREIGN PATENT DOCUMENTS

| | | |
|---|---|---|
| DE | 102012105384 A1 | 9/2012 |
| JP | 1130711 A | 2/1999 |
| JP | 2002163998 A | 6/2002 |
| JP | 200265617 A | 9/2002 |
| JP | 2007100191 A | 4/2007 |
| JP | 2007279493 A | 10/2007 |
| JP | 2008036491 A | 2/2008 |
| JP | 2010527137 A | 2/2010 |

(56) References Cited

FOREIGN PATENT DOCUMENTS

| | | | |
|---|---|---|---|
| JP | 201085977 A | 4/2010 | |
| JP | 2010531051 A | 9/2010 | |
| JP | 2011515537 A | 5/2011 | |
| JP | 2011522707 A | 8/2011 | |
| JP | 2012038969 A | 2/2012 | |
| JP | 2012064783 A | 3/2012 | |
| JP | 2013164436 A | 8/2013 | |
| KR | 20120133272 A | 12/2012 | |
| WO | 9627212 A1 | 9/1996 | |
| WO | 03016209 A1 | 2/2003 | |
| WO | 2008097736 A2 | 8/2008 | |
| WO | 2008150673 A1 | 12/2008 | |
| WO | 2009100053 A2 | 8/2009 | |
| WO | 2009117243 A1 | 9/2009 | |
| WO | 2010042290 A2 | 4/2010 | |
| WO | 2011018778 A1 | 2/2011 | |
| WO | 2011036778 A1 | 3/2011 | |
| WO | 2011140200 A1 | 11/2011 | |
| WO | 2012071330 A1 | 5/2012 | |
| WO | 2012084558 A1 | 6/2012 | |
| WO | 2012175342 A2 | 12/2012 | |
| WO | 2012175343 A1 | 12/2012 | |
| WO | 2013010730 A1 | 1/2013 | |

OTHER PUBLICATIONS

Liu et al., "Integration of Block Copolymer Directed Assembly with 193 Immersion Lithography" American Vacuum Society, J. Vac. Sci. Technol. B 28(6), Nov./Dec. 2010, 5 pp.

Bielawski et al., "Regiospecific One-Pot Synthesis of Diaryliodonium Tetrafluoroborates from Arylboronic Acids and Aryl Iodides," J. Org. Chem. 73:4602-4607, 2008.

Cheng et al., "Developing Directly Photodefinable Substrate Guiding Layers for Block Copolymer Directed Self-Assembly (DSA) Patterning," Proc. of SPIE. 7972:79722I(1)-79722I(13), 2011.

Cheng et al., "Simple and Versatile Methods to Integrate Directed Self-Assembly with Optical Lithography Using a Polarity-Switched Photoresist," ACS Nano, 4(8):4815-4823, 2010.

Cheng, et al., "EUVL Compatible, LER Solutions using Functional Block Copolymers," Alternative Lithographic Technologies IV, Proc. of SPIE, vol. 8323, 2012, 11 pp.

Cho et al., "Polymer Bound Photobase Generators and Photoacid Generators for Pitch Division Lithography," Proc. of SPIE. 7972:797221(1)-797221(8), 2011.

Cupta, "Photoacid Generators for Catalytic Decomposition of Polycarbonate," Thesis for Master of Science, Georgia Institute of Technology, 2006, 137 pp.

Gronheid, R.; Rincon Delgadillo, P.; Nealey, P.; Younkin, T.; Matsunaga, K.; Somervell, M. and Nafus, K. Implementations of self-assembly in a 300mm processing environment. IEEE Litho Workshop. (Jun. 25-28, 2012; Williamsburg, VA, USA).

Maki et al., "Photocleavable Molecule for Laser Desorption Ionization Mass Spectrometry," J. Org. Chem. 72:6427-6433, 2007.

Padmanaban et al., "Application of Photodecomposable Base Concept to 193 nm Resists," Proc. of SPIE. 3999:1136-1146, 2000.

Ross et al., "Si-containing block copolymers for self-assembled nanolithography," J. Vac. Sci. Technol. B. 26 (6):2489-2494, 2008.

Ross et al., "Templated Self-Assembly of Block Copolymer Films," 2012 Materials Research Society (MRS) Fall Meeting & Exhibit, Symposium S: Directed Self-Assembly for Nanopatterning, Nov. 25-30, 2012, Boston, Massachussetts, 64 pp.

Gotrik et al., "Thermosolvent Annealing of Block Copolymer Thin Films for Directed Self-Assembly Applications," 2012 Materials Research Society (MRS) Fall Meeting & Exhibit, Symposium S: Directed Self-Assembly for Nanopatterning, Nov. 25-30, 2012, Boston, Massachussetts, 15 pp.

Ruebner et al., "A cyclodextrin dimer with a photocleavable linker as a possible carrier for the photosensitizer in photodynamic tumor therapy," PNAS. 96(26):14692-14693, 1999.

Skulski, "Organic Iodine(I, Ill, and V) Chemistry: 10 Years of Development at the Medical University of Warsaw, Poland," Molecules. 5:1331-1371, 2000.

Weissman et al., "Recent advances in ether dealkylation," Tetrahedron. 61:7833-7863, 2005.

Gotrik et al., "Morphology Control in Block Copolymer Films Using Mixed Solvent Vapors," ACS Nano, 6(9):8052-8059, 2012.

Hammersky et al., "Self-Diffusion of a Polystyrene-Polyisoprene Block Copolymer," Journal of Polymer Science: Part B: Polymer Physics. 34:2899-2909, 1996.

Jung et al., "Orientation-Controlled Self-Assembled Nanolithography Using a Polystyrene-Polydimethylsiloxane Block Copolymer," Nano Lett. 7(7):2046-2050, 2007.

Jung et al., "A Path to Ultranarrow Patterns Using Self-Assembled Lithography," Nano Lett. 10:1000-1005, 2010.

Postnikov et al., "Study of resolution limits due to intrinsic bias in chemically amplified photoresists," J. Vac. Sci. Technol. B. 17(6):3335-3338, 1999.

Rathsack et al., "Pattern Scaling with Directed Self Assembly Through Lithography and Etch Process Integrations," Proc. of SPIE 8323, Alternative Lithographic Technologies IV, 83230B (Mar. 1, 2012); doi:10.1117/12.916311, 14 pp.

International Searching Authority, International Search Report and Written Opinion issued in corresponding International Application No. PCT/US13/40815, dated Oct. 21, 2013, 15 pp.

Choi et al., "Square Arrays of Holes and Dots Patterned from a Linear ABC Triblock Terpolymer," ACS Nano, 6 (9):8342-8348, 2012.

Foubert et al., "Impact of post-litho LWR smoothing processes on the post-etch patterning result," Proc. of SPIE, 7972:797213(1)-797213(10), 2011.

Tavakkoli K.G. et al., "Templating Three-Dimensional Self-Assembled Structures in Bilayer Block Copolymer Films," Science, 336:1294-1298, 2012.

Cushen et al., "Oligosaccharide/Silicon-Containing Block Copolymers with 5 nm Features for Lithographic Applications" ACS Nano, vol. 6, No. 4, 2012, pp. 3424-3433.

Dean, et al., "Orientation Control of Silicon-containing Block Copolymer Films," Dept. of Chemical Engineering, The University of Texas at Austin, 1 p.

Jarnagin, et al., "Investigation of High c Block Copolymers for Directed Self-Assembly: Synthesis and characterizationof PS-b-PHOST," Alternative Lithographic Technologies IV, Proc. of SPIE, vol. 8323, 2012, 9 pp.

Steven J. Lickteig et al., Optimization of an Integrated and Automated Macro Inspection System for the Utilization of Wafer Color Variation Detection in a Photolithography Cluster, Metrology, Inspection, and Process Control for Microlithography, Proc. of SPIE vol. 6152, 9 pages.

Zhao et al., "Self-reorganization of mixed poly(methyl methacrylate)/polystyrene brushes on planar silica substrates in reponse to combined selective solvent treatments and thermal annealing", Polymer 45 (2004) 7979-7988.

International Searching Authority, Search Report and Written Opinion issued in corresponding International Application No. PCT/US2014/016766 dated May 26, 2014, 11 pages.

International Searching Authority, Search Report and Written Opinion issued in corresponding International Application No. PCT/US2014/016776 dated May 30, 2014, 12 pages.

Vayer et al., "Perpendicular orientation of cylindrical domains upon solvent annealing thin films of polystyrene-b-polylactide", Thin Solid Films 518 (2010) 3710-3715.

Peng et al., "Development of Nanodomain and Fractal Morphologies in Solvent Annealed Block Copolymer Thin Films", Macromolecular Rapid Communications 2007, 28, 1422-1428.

Yu et al., "Self-assembly of polystyrene—poly(4-vinylpyridine) in deoxycholic acid melt", Polymer, Elsevier Science Publishers B.V, GB, vol. 52, No. 18, Jul. 13, 2011, pp. 3994-4000.

International Searching Authority, Search Report and Written Opinion issued in corresponding International Application No. PCT/US2014/026969 dated Jul. 16, 2014, 15 pages.

(56) References Cited

OTHER PUBLICATIONS

International Searching Authority, Search Report and Written Opinion issued in corresponding International Application No. PCT/US2014/027016 dated Jul. 23, 2014, 11 pages.
International Searching Authority, Search Report and Written Opinion issued in corresponding International Application No. PCT/US2014/023926 dated Jul. 25, 2014, 10 pages.
International Searching Authority, Search Report and Written Opinion issued in corresponding International Application No. PCT/US2014/016760 dated Nov. 6, 2014, 11 pages.
International Searching Authority, Search Report and Written Opinion issued in corresponding International Application No. PCT/US14/61392, dated Jan. 8, 2015, 9 pages.
Taiwan Patent Office, Examination Opinion issued in related TW Application No. 102117111, dated May 21, 2015, 17 pp.
Taiwan Intellectual Property Office, Notification of Examination Opinion issued in corresponding Taiwan Application No. 103136203 dated Aug. 31, 2015, 11 pp., including English translation.
Taiwan Intellectual Property Office, Rejection Decision issued in corresponding Taiwan Application No. 103136203, dated Feb. 22, 2016, 5 pp. including English translation.
International Searching Authority, Search Report and Written Opinion issued in related International Application No. PCT/US2014/016760 dated Nov. 6, 2014, 11 pages.
Taiwan Intellectual Property Office, English translation of Notification of Examination Opinion issued in related Taiwan Application No. 103108241 dated Jun. 12, 2015, 4 pp.
Taiwan Intellectual Property Office, Notification of Examination Opinion issued in related Taiwan Application No. 103136203 dated Aug. 31, 2015, 11 pp., including English translation.
International Search Authority, Search Report and Written Opinion issued in related International Application No. PCT/US14/52292, dated Jan 22, 2015, 12 pp.
Taiwan Intellectual Property Office, Notification of Examination Opinion issued in related Taiwan Application No. 103130469 dated May 21 2015, 9 pp., including English translation.
International Bureau of WIPO, International Preliminary Report on Patentability issued for International related Application No. PCT/US2014/052292 dated Mar. 17, 2016, 8 pp.
Taiwan Intellectual Property Office, Notification of Examination Opinion issued in related Taiwan Application No. 103136201 dated Feb. 22, 2016, 11 pp., including English translation.
Taiwan Intellectual Property Office, Notification of Examination Opinion issued in related Taiwan Application No. 103136201 dated Feb. 18, 2016, 11 pp., including English translation.
Taiwan Intellectual Property Office, Notification of Examination Opinions issued in related TW Application No. 10313620, dated Feb 22, 2016, 11 pp. with English translation.
International Searching Authority, Search Report and Written Opinion issued in related International Application No. PCT/US14/61396, dated Jan. 21, 2015, 9 pages.
International Searching Authority, Search Report and Written Opinion issued in related International Application No. PCT/US14/61392, dated Jan. 8, 2015, 9 pages.
Taiwan Intellectual Property Office, Rejection Decision issued in related Taiwan Application No. 103136203, dated Feb. 22, 2016, 5 pp. including English translation.
Korean Intellectual Property Office, Office Action issued in related Korean Application No. 10-2015-7026370 dated Jul. 15, 2016, 19 pp. including English Translation.
Korean Intellectual Property Office, Office Action issued in related Korean Application No. 10-2015-7028220 dated Jul. 15, 2016, 7 pp. including English Translation only.
English Translation of Korean Intellectual Property Office, Office Action issued in corresponding Korean Application No. 10-2015-7028220 dated Jul. 15, 2016, 7 pp. (Korean Language document not provided).

International Searching Authority, International Search Report and Written Opinion issued in related International Application No. PCT/US13/40815, dated Oct. 21, 2013, 15 pp.
International Searching Authority, Search Report and Written Opinion issued in related International Application No. PCT/US2014/016766 dated May 26, 2014, 11 pages.
International Searching Authority, Search Report and Written Opinion issued in related International Application No. PCT/US2014/016776 dated May 30, 2014, 12 pages.
International Searching Authority, Search Report and Written Opinion issued in related International Application No. PCT/US2014/026969 dated Jul. 16, 2014, 15 pages.
International Searching Authority, Search Report and Written Opinion issued in related International Application No. PCT/US2014/027016 dated Jul. 23, 2014, 11 pages.
International Searching Authority, Search Report and Written Opinion issued in related International Application No. PCT/US2014/023926 dated Jul. 25, 2014, 10 pages.
English Translation of Korean Intellectual Property Office, Office Action issued in related Korean Application No. 10-2015-7028220 dated Jul. 15, 2016, 7 pp. (Korean Language document not provided).
Taiwan Intellectual Property Office, English translation of Notification of Examination Opinion issued in corresponding Taiwan Application No. 103108241 dated Jun. 12, 2015, 4 pp.
International Search Authority, Search Report and Written Opinion issued in counterpart International Application No. PCT/US14/52292, dated Jan 22, 2015, 12 pp.
Taiwan Intellectual Property Office, Notification of Examination Opinion issued in corresponding Taiwan Application No. 103130469 dated May 21 2015, 9 pp., including English translation.
International Bureau of WIPO, International Preliminary Report on Patentability issued for International counterpart Application No. PCT/US2014/052292 dated Mar. 17, 2016, 8 pp.
Taiwan Intellectual Property Office, Notification of Examination Opinion issued in corresponding Taiwan Application No. 103136201 dated Feb. 18, 2016, 11 pp., including English translation.
Taiwan Intellectual Property Office, Notification of Examination Opinions issued in counterpart TW Application No. 10313620, dated Feb 22, 2016, 11 pp. with English translation.
Korean Intellectual Property Office, Office Action issued in corresponding Korean Application No. 10-2015-7026370 dated Jul. 15, 2016, 19 pp. including English Translation.
Korean Intellectual Property Office, Office Action issued in corresponding Korean Application No. 10-2015-7028220 dated Jul. 15, 2016, 7 pp. including English Translation only.
Japan Patent Office, Official Action issued in related JP Patent Application No. 2016-502295 dated Aug. 23, 2016, 11 pp., including English translation.
Japan Patent Office, Official Action issued in related JP Patent Application No. 2016-500282 dated Sep. 6, 2016, 8 pp., including English translation.
Korean Intellectual Property Office, Office Action issued in related Korean Application No. 10-2015-7026176 dated Dec. 5, 2016, 9 pp. including English translation.
Japan Patent Office, Official Action issued in related JP Patent Application No. 2015-512726 dated Jan. 4, 2017, 14 pp., including English translation.
Japan Patent Office, Office Action issued in related Patent Application No. JP2016-500283 dated Dec. 20, 2016, 19 pp., including English translation.
Japan Patent Office, Office Action issued in counterpart JP Patent Application No. 2016-549215 dated Feb. 28, 2017, 6 pp., including English translation.
Japan Patent Office, Final Office Action issued in related JP Patent Application No. 2016-500283 dated Mar. 28, 2017, 9 pp., including English translation.
Japan Patent Office, First Office Action issued in related JP Patent Application No. 2016-549216 dated Jun. 6, 2017, 11 pp., including English translation..

(56) References Cited

OTHER PUBLICATIONS

Korean Intellectual Property Office, Office Action issued in related KR Patent Application No. 10-2016-7013228 dated Jul. 12, 2017, 12 pp., including English translation.

* cited by examiner

USE OF GRAPHO-EPITAXIAL DIRECTED SELF-ASSEMBLY APPLICATIONS TO PRECISELY CUT LOGIC LINES

The present application is a continuation-in-part of U.S. patent application Ser. No. 14/518,548 filed Oct. 20, 2014 and entitled USE OF GRAPHO-EPITAXIAL DIRECTED SELF-ASSEMBLY TO PRECISELY CUT LINES, which claims the benefit of and priority to U.S. Provisional Patent Application Nos. 61/893,277 and 61/893,275, each filed on Oct. 20, 2013, the disclosures of which are hereby incorporated by reference herein in their entirety.

FIELD OF THE INVENTION

This invention relates to Directed Self-Assembly (DSA) of block copolymers (BCPs) and using them to make arrays of cut patterns in line structures.

BACKGROUND OF THE INVENTION

One of the limitations on the density scaling of integrated circuit (IC) patterns is the distance between two line ends. Fundamentally, this structure does not follow the same optical scaling as other features in critical circuit patterns (e.g., the critical dimension of a line). Therefore, the industry is always looking for better ways to bring line ends closer together. Starting around the 45 nm node, many IC manufacturers began a double patterning scheme where the lines were created using a first lithographic pattern, and then cut with structures resembling trenches or holes created during a second lithographic step.

In lithography, the creation of regular structures has a variety of applications. From a cost standpoint, the more densely that the structures are packed into a given area, the cheaper it is to fabricate the device. One of the key steps in creating a dense array of a patterned material is to cut an array of densely packed lines.

FIG. 1A depicts an array of densely packed lines 10, which constitute an existing topography 20 on a substrate 18. FIG. 1B then depicts a standard means for cutting the lines 10, namely a trench 12 is patterned in a photoresist 14 applied over the topography 20. FIG. 1C depicts the resulting array 60 of cut lines 10'. As we continue the path of scaling, however, the lithography of the printing of a trench pattern is reaching the limits of what can be achieved optically. This leads to a limit for the end-to-end spacing for abutting lines, and an overall decrease in the packing density of the circuits comprising these lines.

There is thus a need for means to allow smaller cut spaces to be created, and ideally, the means for making the cuts should be less expensive and require less critical lithography.

SUMMARY OF THE INVENTION

A method for forming a patterned topography on a substrate is provided. The substrate is initially provided with a plurality of lines formed atop. An embodiment of the method includes aligning and preparing a first directed self-assembly (DSA) pattern immediately overlying the plurality of lines, transferring the first DSA pattern to form a first set of cuts in the plurality of lines, aligning and preparing a second DSA pattern immediately overlying the plurality of lines having the first set of cuts formed therein, and transferring the second DSA pattern to form a second set of cuts in the plurality of lines. The first DSA pattern includes a first set of trenches of a first trench width and a first set of holes of diameter d; and the second DSA pattern includes a second set of trenches of a second trench width and a second set of holes of diameter d, and both the first and second DSA patterns each comprise a block copolymer having a hexagonal close-packed (HCP) morphology, a characteristic dimension $L_o$ that is approximately equal to the spacing between individual lines of the plurality of lines, and a minority cylindrical phase of the diameter d. The first and second sets of trenches are preferential to wetting by a majority phase of the block copolymer and guide formation of the first and second sets of holes, respectively, from the minority cylindrical phase. The first and second trench widths are less than or equal to the $L_o$ and greater than diameter d, the distance between trenches of the first set of trenches and between trenches of the second set of trenches is approximately equal to the diameter d, and the distance between edges of adjacent holes in the first set of holes and between edges of adjacent holes in the second set of holes is approximately equal to the first and second trench widths, respectively. The aligning and preparation of the second DSA pattern includes overlapping a position of the second set of trenches with a position of the first set of trenches such that areas between holes of the first set of holes and adjacent holes of the second set of holes are shared by adjacent trenches of the first and second sets of trenches.

BRIEF DESCRIPTION OF THE DRAWINGS

The accompanying drawings, which are incorporated in and constitute a part of this specification, illustrate embodiments of the present invention and, together with a general description of the invention given above, and the detailed description of the embodiments given below, serve to explain the principles of the present invention.

DETAILED DESCRIPTION

Figure 1A:
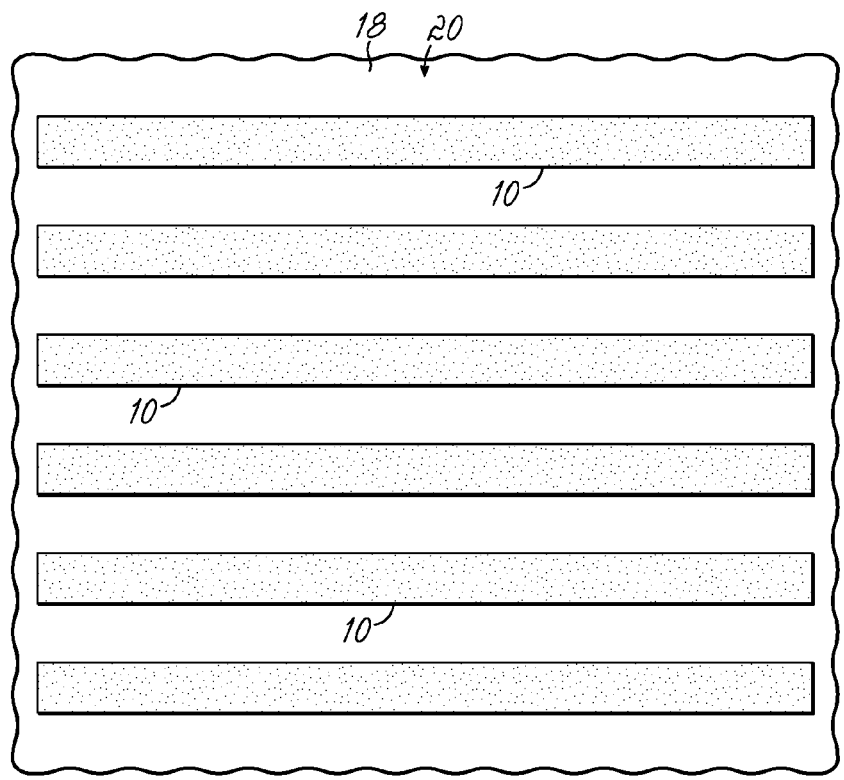
FIGS. 1A-1C schematically depict an array of lines, a patterned resist for cutting the lines, and the resulting array of cut lines, according to the prior art.
Figure 1B:
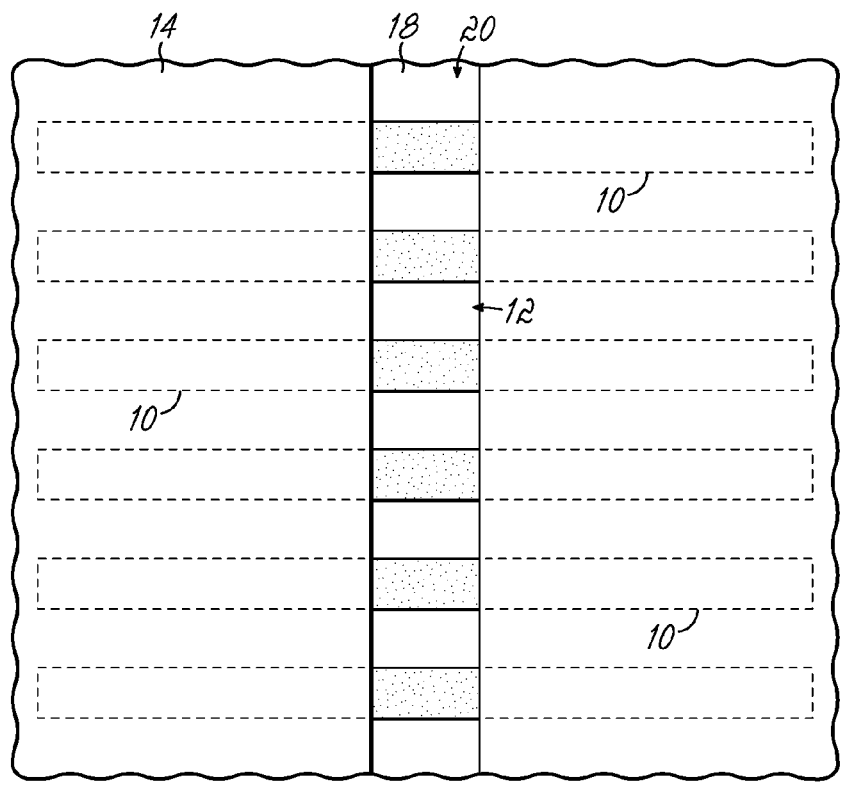
Figure 1C:
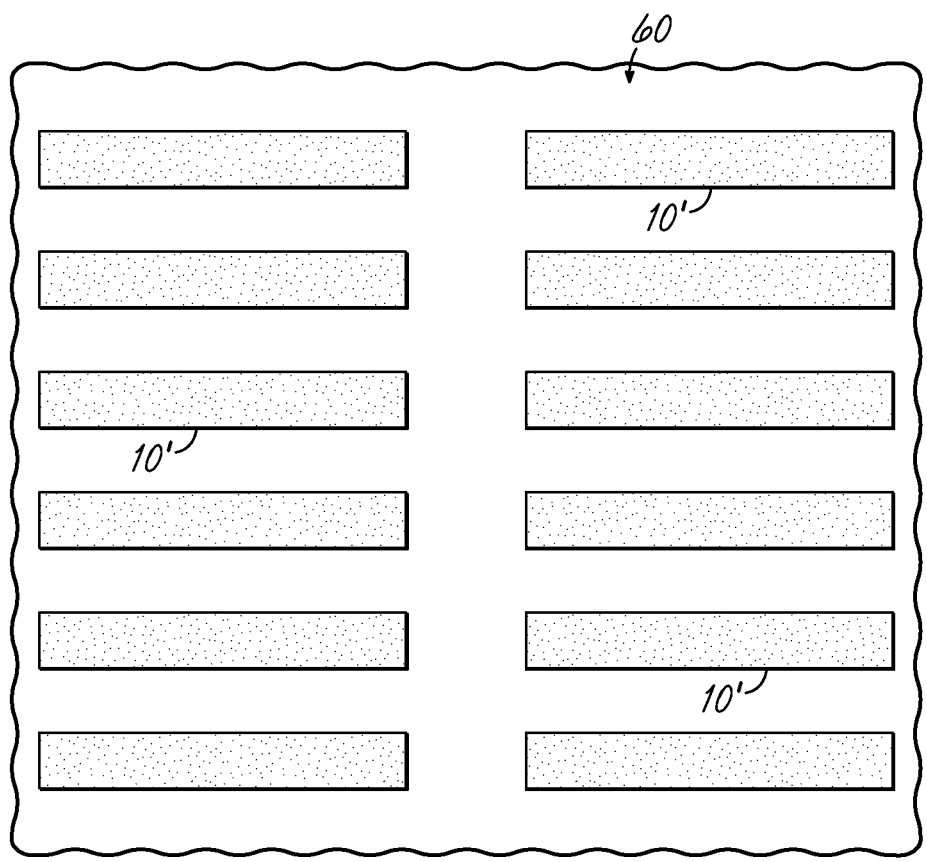

Methods of designing and using grapho-epitaxy and optionally chemo-epitaxy to drive assembly of a block copolymer for patterning line features are disclosed in various embodiments. However, one skilled in the relevant art will recognize that the various embodiments may be practiced without one or more of the specific details or with other replacement and/or additional methods, materials, or components. In other instances, well-known structures, materials, or operations are not shown or described in detail to avoid obscuring aspects of various embodiments of the present invention.

Similarly, for purposes of explanation, specific numbers, materials, and configurations are set forth in order to provide a thorough understanding. Nevertheless, the embodiments of the present invention may be practiced without specific details. Furthermore, it is understood that the illustrative representations are not necessarily drawn to scale.

Reference throughout this specification to "one embodiment" or "an embodiment" or variation thereof means that a particular feature, structure, material, or characteristic described in connection with the embodiment is included in at least one embodiment of the invention, but does not denote that they are present in every embodiment. Thus, the appearances of the phrases such as "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

Additionally, it is to be understood that "a" or "an" may mean "one or more" unless explicitly stated otherwise.

Various operations will be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment.

Various additional operations may be performed and/or described operations may be omitted in additional embodiments.

This invention is directed to the use of block copolymers (BCPs) to perform cuts in lines, and details how to systematically create the tightest packing of features for a given BCP. BCPs can be used in such an application because they fundamentally want to achieve a thermodynamic microstructure of very fine dimensions. Overall, this invention will allow smaller cut spaces to be created, with less expense because less critical lithography will be required.

More specifically, this invention is directed to cutting lines using a grapho-epitaxial and optionally chemo-epitaxial application of directed self-assembly (DSA). The fundamentals of BCPs dictate the required geometries and so determine the tightest packing that can be achieved using a two print, two etch, two DSA process integration. When this system is applied to achieve a tight packing density, it leads to an array of island structures that are at pitches (x and y) dependent on the characteristic length ($L_o$) of the BCP. Looser pitch structures can also be achieved through appropriate choice of the spacing of trenches. Furthermore, the scheme bypasses overlay issues in other approaches by using the topography that will eventually be cut to align and anchor the cylinders formed by the BCPs. In the end, the present invention leverages the fundamentals of BCPs and the topography in the system to place openings in specific locations so that lines may be cut as desired.

As described in FIGS. 2A-2G, scaling of the cuts can be made with the use of DSA of BCPs. A simple approach is to use a grapho-epitaxy structure to form holes that will then allow access to the lines for cutting.

Figure 2A:
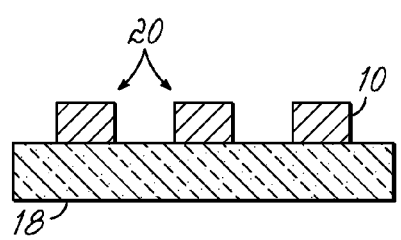
FIGS. 2A-2G schematically depict in cross-sectional view a grapho-epitaxy approach to forming holes to allow access to the lines for cutting, using a single hardmask.
Figure 2B:
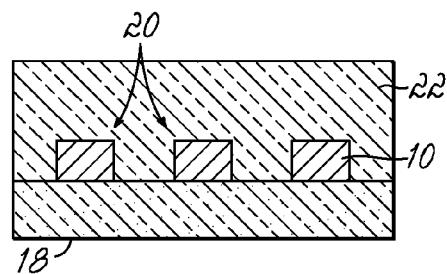
Figure 2C:
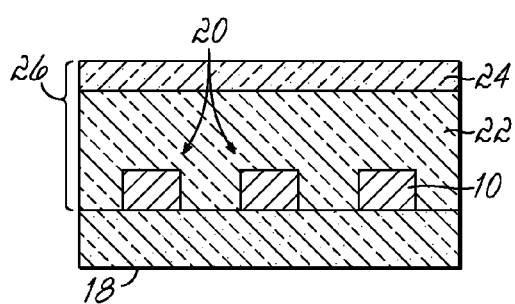
Figure 2D:
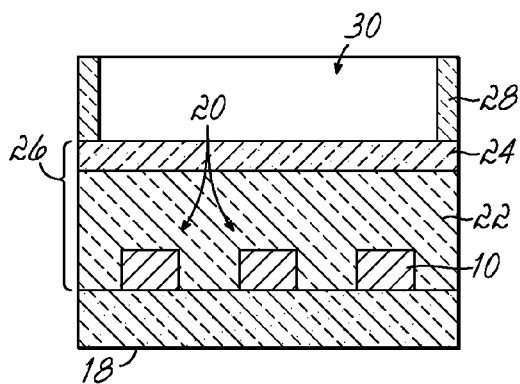
Figure 2E:
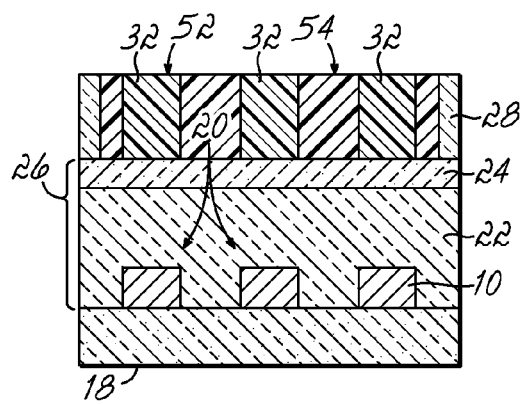
Figure 2F:
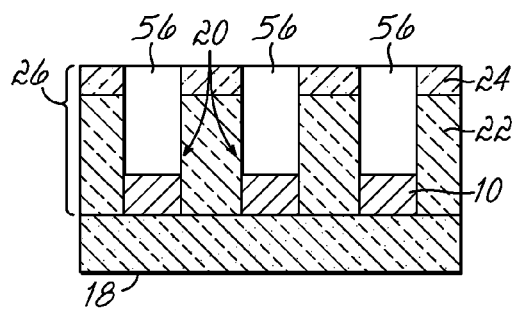
Figure 2G:
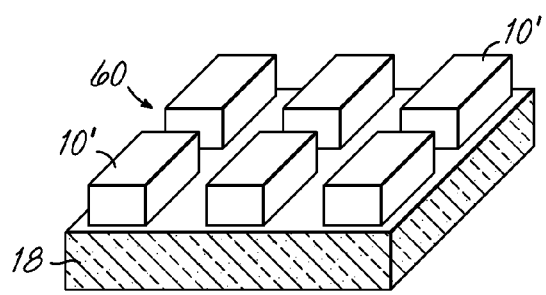

In FIG. 2A, a pre-existing topography 20 is depicted as an array of densely packed lines 10 on a substrate 18. In FIGS. 2B-2C, the topography 20 is then coated with a dual-layer BARC (bottom anti-reflective coating) 26, including a planarization layer 22 (e.g., a spin-on carbon (SOC) layer) in FIG. 2B and an anti-reflective coating (ARC) layer 24 (e.g., a silicon ARC) in FIG. 2C. In an alternative embodiment, a CVD (chemical vapor deposition) stack is used in place of the dual layer BARC 26, such as an alpha carbon coating and a SiON coating in place of the SOC and SiARC coatings. A layer of radiation-sensitive material, e.g., photoresist layer 28, is then applied over the BARC 26 and then patterned to open up a trench, which serves as a grapho-epitaxy template 30, as shown in FIG. 2D. A BCP 50 is then applied to the patterned photoresist layer 28 to fill the template 30 (partially or completely), and then annealed during which the grapho-epitaxy template 30 guides the formation of a cylindrical morphology, as shown in FIG. 2E. More specifically, the anneal causes a first block 52 of the BCP to form a plurality of cylinders 32 aligned over the lines 10 within a matrix of a second block 54 of the BCP. Subsequent development of the BCP 50 to remove the cylindrical morphology forms contact holes 56 within the template 30 overlying the topography 20. These contacts holes 56 are transferred by etching down through the BARC 26 to expose the lines 10 of the underlying topography 20, as shown in FIG. 2F, and the exposed topography 20 is then used to form an array 60 of cut lines 10', as shown in FIG. 2G.

Figure 3A:
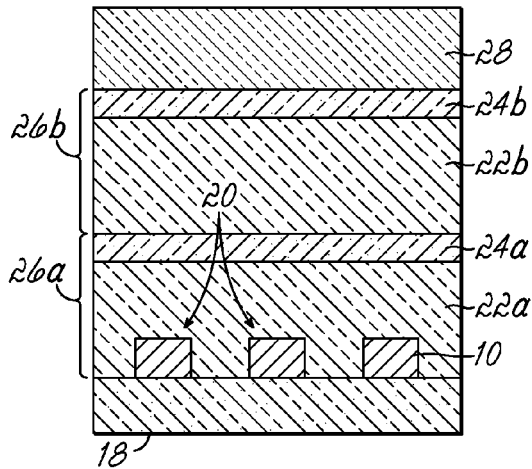
FIGS. 3A-3F schematically depict in cross-sectional view an alternate grapho-epitaxy approach to forming holes to allow access to the lines for cutting, using two hardmasks.
Figure 3B:
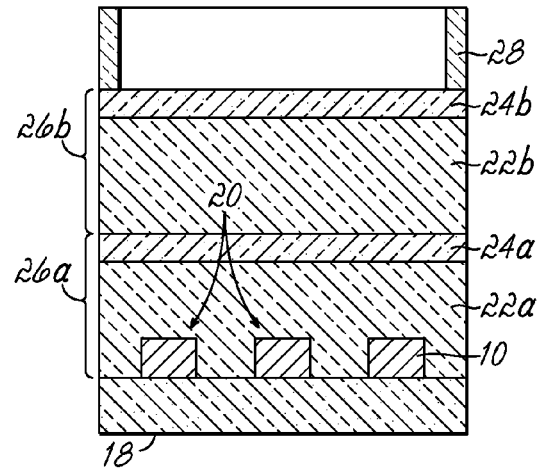
Figure 3C:
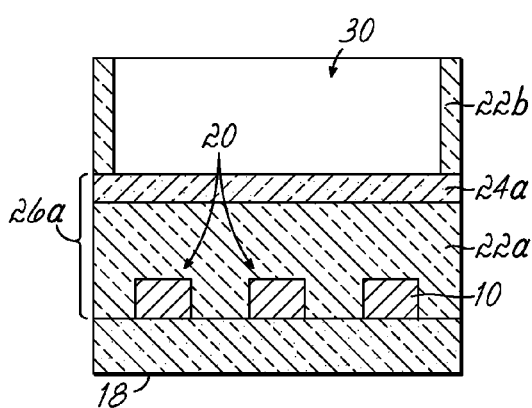
Figure 3D:
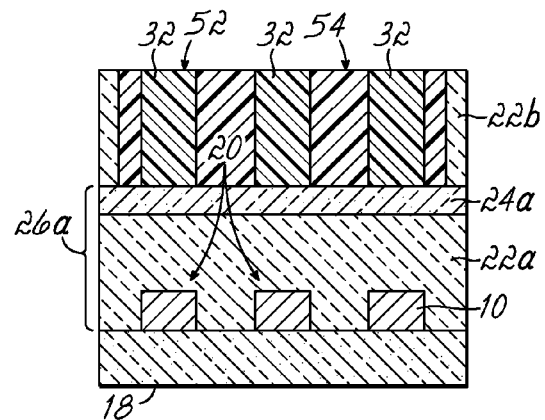
Figure 3E:
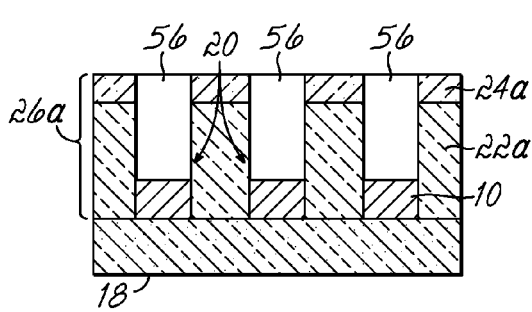
Figure 3F:
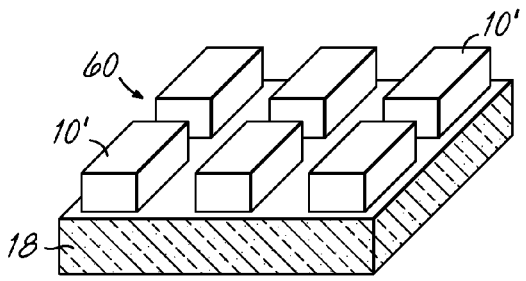

Another approach for cutting lines is depicted in FIGS. 3A-3F, where the photoresist layer 28 is used to pattern another material that would function as a template. For example, a photoresist layer 28 could be used to transfer the pattern into a hardmask and then the hardmask template could be used for the creation of the DSA holes. As shown in FIG. 3A, the stack includes a first planarization layer 22a (e.g., SOC coating) over the array of lines 10, a first ARC layer 24a (e.g., SiARC coating) over the first planarization layer 22a, a second planarization layer 22b (e.g., SOC coating) over the first ARC layer 24a, and a second ARC layer 24b (e.g., SiARC coating) over the second planarization layer 22b, with the photoresist layer 28 applied over the second ARC layer 24b. Thus, there are two hardmask layers 26a and 26b. FIG. 3B depicts patterning the photoresist layer 28 to open up a trench, which is then transferred through the second ARC layer 24b and into the second planarization layer 22b. FIG. 3C depicts the DSA template 30 in the second planarization layer 22b. The BCP 50 is then applied to the patterned second planarization layer 22b to fill the template 30 (partially or completely), and then annealed during which the grapho-epitaxy template 30 guides the formation of a cylindrical morphology, as shown in FIG. 3D. The DSA pattern would thus have to be transferred through both hardmasks 26a, 26b to enable access to the lines 10, as shown in FIG. 3E, so that the array 60 of cut lines 10' can be formed, as shown in FIG. 3F.

Both of these process flows (FIGS. 2A-2G and 3A-3F) are alike in that they separate the DSA from the etch transfer and cutting of the lines. One of the primary reasons for this approach is to avoid the complexity of having the self-assembly process happen on top of the topography itself. Fundamentally, however, there is a significant complication from this kind of approach. Since the BCP is separated from the topography, the only means for aligning the BCP to the underlying topography that will be cut is through the template. The present invention is directed to using the topography to align the BCP directly thereon.

Figure 4:
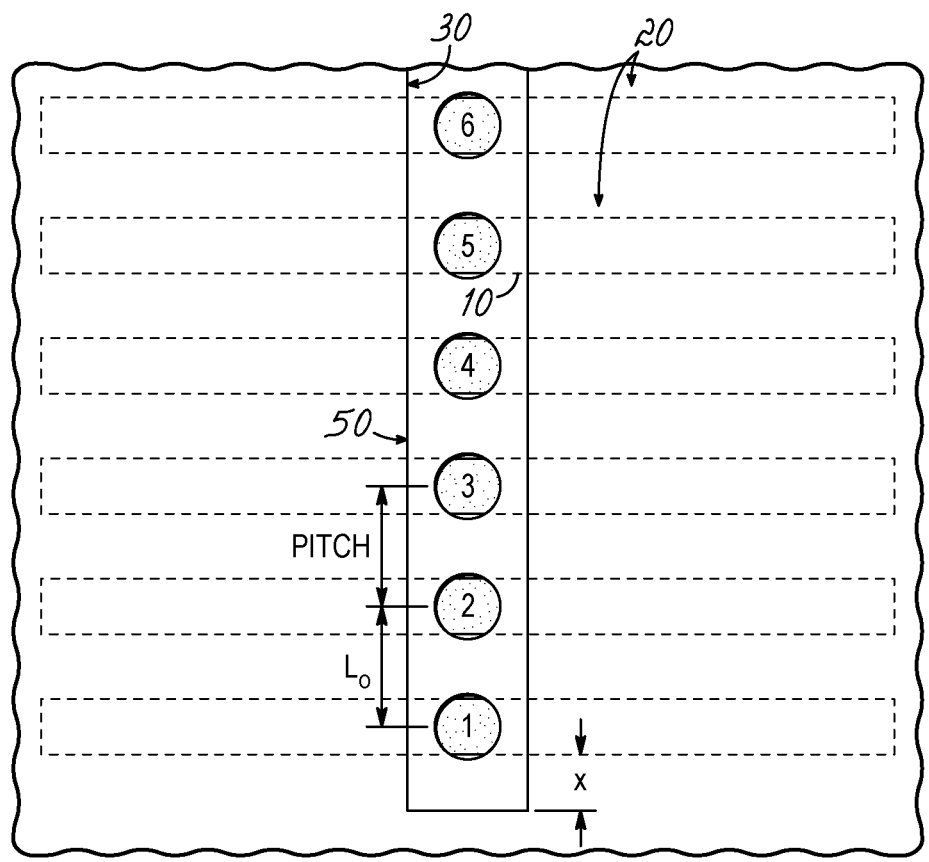
FIG. 4 depicts in top schematic view the termination of the grapho-epitaxial template.

The illustration of FIG. 4 shows the termination of the grapho-epitaxial trench template. The overlay between the trench template 30 and the underlying topography 20 is depicted as x and this overlay dictates where the end of the trench template 30 will be positioned. This placement, in turn, dictates the placement of the first hole (labeled 1). Ideally, the end of the trench template 30 will be placed so that the first hole 1 will be perfectly placed on top of the first line 10. The placement of the subsequent holes, 2, 3, 4, etc., will be dictated by the characteristic length, $L_o$, of the BCP. In the case where the $L_o$ of the BCP perfectly matches the pitch of the lines 10, the subsequent holes will be placed perfectly on top of the lines, as shown. However, even if the pitch is perfectly matched between one BCP and the pitch of the lines, the inherent batch to batch variation in $L_o$ of the BCP will result in catastrophic error in placement of the holes. Suppose that the desired pitch is 32.00 nm, and batch A of the BCP in question has an $L_o$ of 32.00 nm. In this case the system will result in prefect placement of the holes over the lines. Batch B of the BCP is then installed, and it has an $L_o$ of 32.01 nm. After 100 holes are placed, the $100^{th}$ hole will have a placement error of 1 nm. If the spec for the overlay is 5% of the pitch (or 1.6 nm), then after placement of 160 holes, the placement will be out of spec. After 1600 holes, the error would be 16 nm, and the hole would be perfectly misaligned. In memory applications where lines would be cut in arrays that could have thousands of lines, if the self-assembly is agnostic to the underlying pattern, the batch to batch variation of the BCP's $L_o$ will definitely result in failure.

To mitigate this effect, the present invention uses the topography to anchor the placement of the holes. BCPs in general have the ability to stretch a little bit in order to accommodate their surroundings. As long as this stretching is not too dramatic, the BCPs can easily adopt a configuration that is slightly incommensurate with the BCP's $L_o$. Therefore, a method is disclosed where the topography is made in such a way that it will want to attach itself to the topography.

Figure 5A:
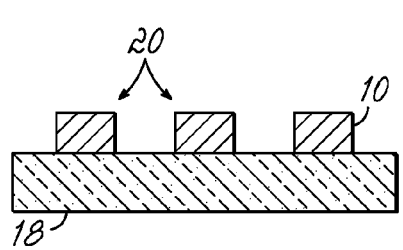
FIGS. 5A-5L depict in schematic cross-sectional view an embodiment of a method for patterning lines using directed self-assembly in accordance with the invention.
Figure 5B:
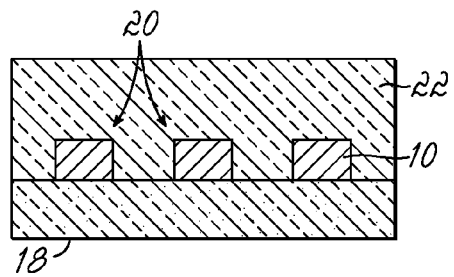
Figure 5C:
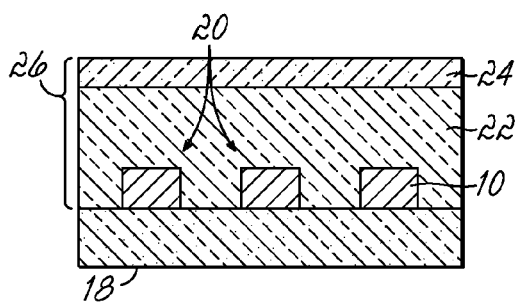

Depicted in schematic cross-sectional view in FIGS. 5A-5L, an array of features, specifically lines 10, has been patterned on a substrate 18, such as a semiconductor wafer, to provide a starting topography 20, as shown in FIG. 5A, and the desire is to cut these lines 10 in specific locations. To that end, in FIG. 5B, a planarization layer 22 is applied to planarize the topography 20. Planarization layer 22 may be, for example, a spin-on carbon layer. The planarization layer 22 will ultimately form the template for the grapho-epitaxy aspect of the invention. Next, as shown in FIG. 5C, an anti-reflective coating (ARC) layer 24, such as a silicon ARC, is coated on top of the planarization layer 22. It may be understood that the ARC layer 24 may not by itself act as an antireflective coating, but rather, is more generically a second layer that acts in combination with the planarization layer to provide a dual-layer bottom ARC (BARC) 26. Nonetheless, the second layer (layer 24) may be referred to as an ARC layer for the reason that it provides the antireflective properties when combined with the first layer (planarization layer 22). The thicknesses and optical properties of these layers, which form the dual-layer BARC 26, are tailored so that the substrate reflectivity is minimized.

Figure 5D:
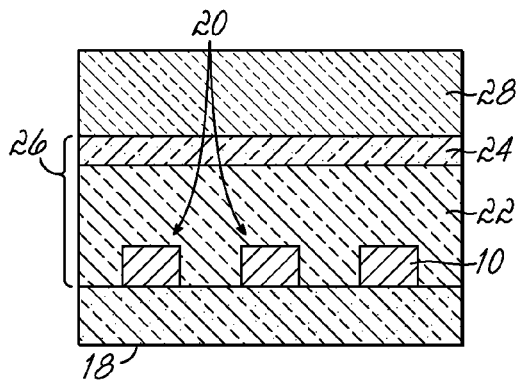
Figure 5E:
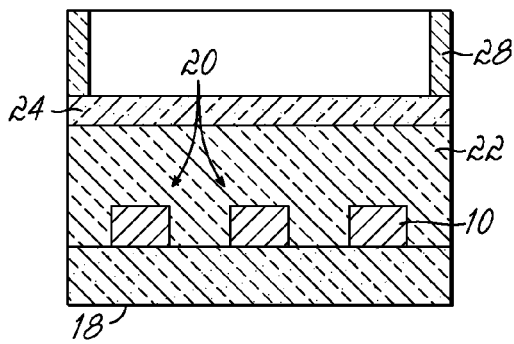
Figure 5F:
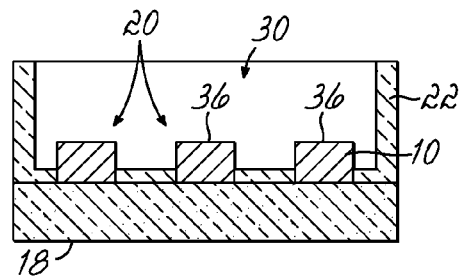

A layer of radiation-sensitive material, e.g., photoresist 28, is coated, as shown in FIG. 5D, and patterned (imaged) on top of this dual-layer BARC 26, as shown in FIG. 5E, and the photoresist image is subsequently transferred into the planarization layer 22 through traditional reactive ion etching (RIE) processing, as shown in FIG. 5F (the photoresist 28 and ARC layer 24 are also removed) thereby forming the template 30 in the planarization layer 22. The depth of etching into the planarization layer 22 may be complete, so as to expose an upper surface of the underlying substrate 18, or partial, so as to leave a portion of the planarization layer 22 at the bottom of the template 30. In either case, surface portions 36 of the lines 10 are exposed, so as to reveal an exposed topography 20 surrounded by the template 30.

Figure 5G:
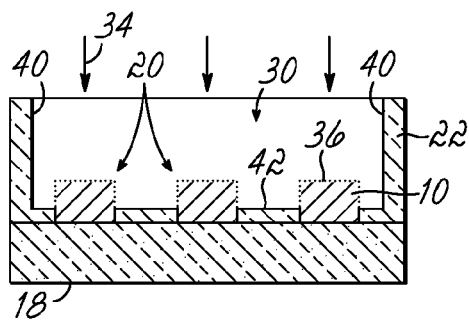

The next step, depicted in FIG. 5G, is an optional surface treatment 34 of the pattern transferred into the planarization layer 22 that will impact the self-assembly of the BCP. As described below in more detail, this treatment is needed in some cases and is not needed in other cases. Further, the surface treatment can effect a change in surface properties of certain surfaces while leaving other surfaces unchanged. For example, as depicted in FIG. 5G, the surface treatment 34 can alter the exposed surface portions 36 of the lines 10, while leaving the sidewalls 40 and bottom surfaces 42 of the template 30 unchanged.

Figure 5H:
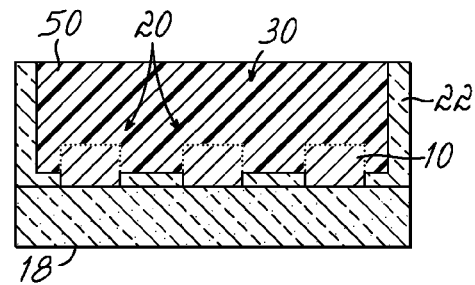
Figure 5I:
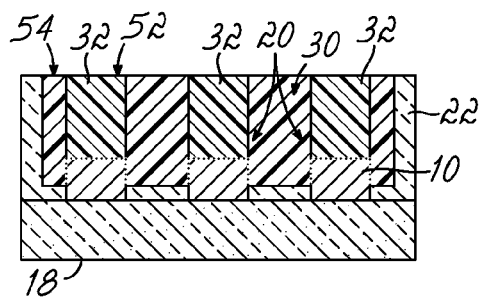
Figure 5J:
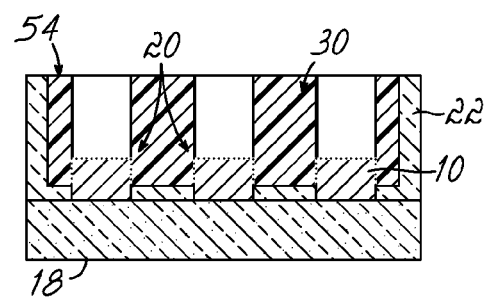
Figure 5K:
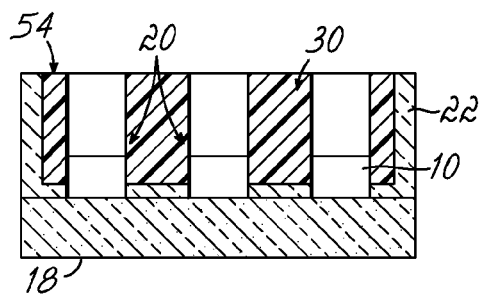
Figure 5L:
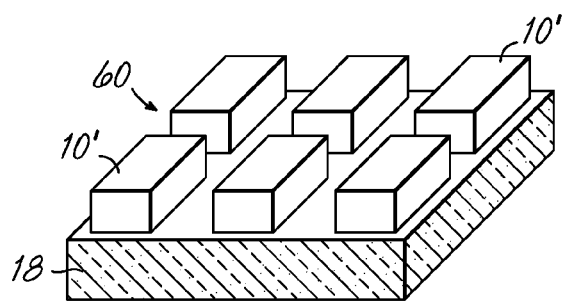

After this optional surface treatment, a BCP 50 is applied to the pattern, as shown in FIG. 5H to fill the template 30 (partially or completely), and then annealed allowing the BCP to form a cylindrical morphology, as shown in FIG. 5I. More specifically, the anneal causes a first block 52 of the BCP to form a plurality of cylinders 32 aligned over the lines 10 within a matrix of a second block 54 of the BCP. Subsequent development of the BCP 50 to remove the cylindrical morphology, i.e., the first block 52 of the BCP 50, as shown in FIG. 5J, gives access to the topography 20 by exposing the DSA pattern immediately overlying the topography 20. There is then access to make the appropriate cuts of the underlying array of lines 10, as shown in FIG. 5K, so etching can be done and selected lines 10 cut, as the circuit design requires, to form a patterned topography. The substrate 18 is then stripped to reveal the patterned topography, i.e., an array 60 of cut lines 10', as shown in FIG. 5L.

Here the DSA template that is created allows access to the topography and so enables the self-assembled holes to graft to the topography without placement error. In application Ser. No. 14/517,270 (CT-117US1), entitled "Use of Topography to Direct Assembly of Block Copolymers in Grapho-Epitaxial Applications", now U.S. Pat. No. 9,349,604, incorporated by reference herein in its entirety, this concept is explained in further detail. The present invention builds upon that concept to describe a method for creating the tightest density possible with this grapho-epitaxial and optionally chemo-epitaxial, guided hole approach.

Described above is a process for making guided contact holes within a trench. Multiple passes of this technique will now be combined to create the highest density of cuts possible. Ultimately, the packing of line cuts is defined by the BCP, and by combining these fundamental polymer physics with the topography anchoring concept discussed above, we discover a novel integration for creating these structures.

Figure 6:
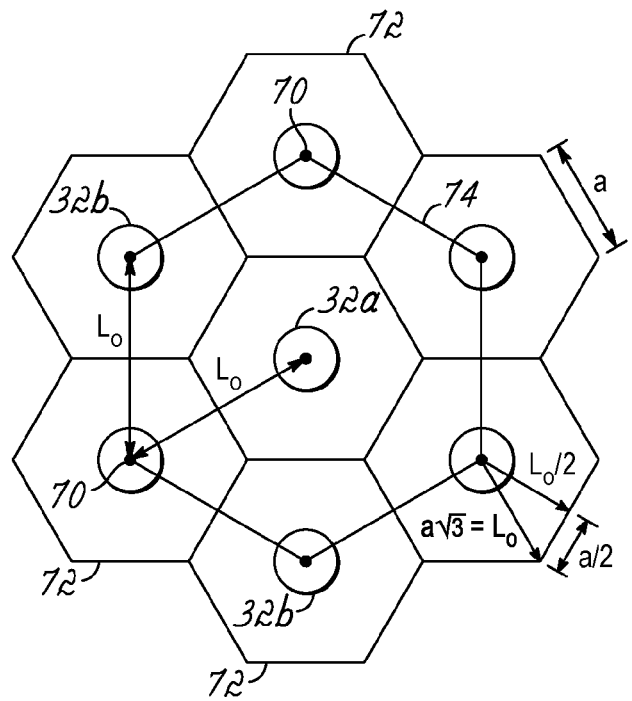
FIG. 6 is a schematic representation of the hexagonal close-packed morphology of the BCP.

To start, we first introduce some of the fundamentals of BCPs that form vertical cylinders. If a cylinder-forming BCP is assembled on top of a neutral surface, it forms a hexagonal close-packed (HCP) structure, i.e. morphology, as shown in FIG. 6. The dots 70 represent the centers of the cylinders 32a, 32b (32a,b) that form within the matrix, and like all HCP structures, there are two kinds of hexagonal unit cells that can be displayed. First, one can construct a hexagon 72 around each of the cylinders 32a,b and these cylinders 32a,b then perfectly fit into a 2-D array. There is a second larger hexagon 74 that can be created around a central cylinder 32a by connecting the centers 70 of the surrounding cylinders 32b. This second hexagonal structure 74 is of particular importance in describing BCPs because the characteristic length $L_o$ of these systems is defined by this center to center distance, and so $L_o$ is both the length of the edge of the larger hexagon 74, and is also the distance from the center cylinder to any of the external vertices. For discussion purposes, the length of the edge of the second smaller unit cell (hexagon 72) will be defined as a. The dimensions a and $L_o$ are related by the properties of a 30-60-90 triangle. Though not derived directly here, the lengths two unit cells are geometrically related are given by the equation:

$$L_o = a\sqrt{3}$$

The geometric configuration dictates the state that the BCP would like to assume in its natural state. This equates to the lowest free-energy configuration of the polymer, such that if the BCP is allowed to retain this configuration as its assembly is guided, the lowest possible pattern defectivity will be attained. It bears noting that $L_o$ as defined for lithographic processing, and for the present invention, differs from $L_o$ as defined for purposes of crystallography. For example, in crystallography, $L_o$ may be defined as the distance between the planes of cylinders that cause scattering of x-rays (i.e., 1.5×a in FIG. 7). In lithography, the characteristic dimension $L_o$ of the BCP is defined as the center to center distance between holes. Thus, the different definitions are related as: $L_o$(lithography)=$2/\sqrt{3} \times L_o$(crystallography)=$1.1547 \times L_o$(crystallography).

Figure 7:
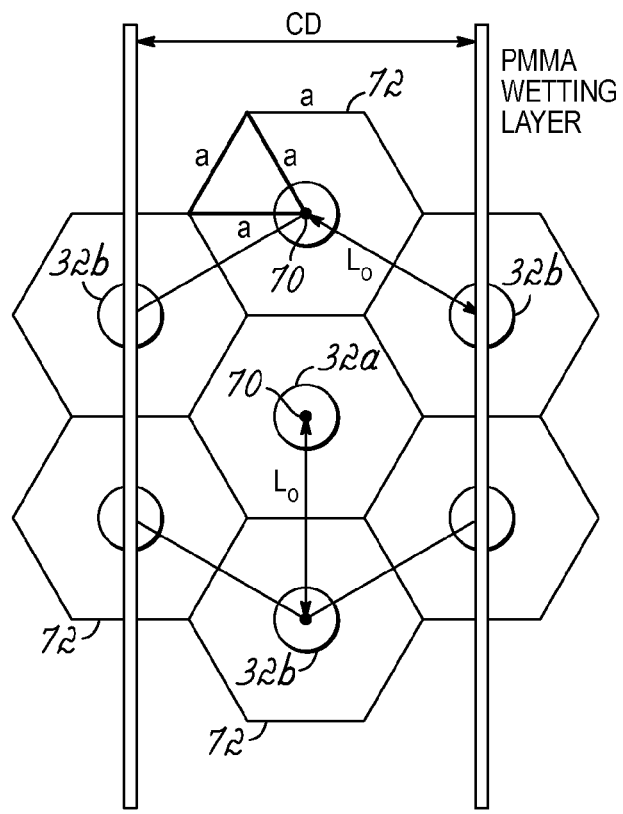
FIG. 7 schematically depicts the dimensional considerations for the morphology of FIG. 6 in the case of preferential wetting by the minority phase of the BCP.
Figure 8:
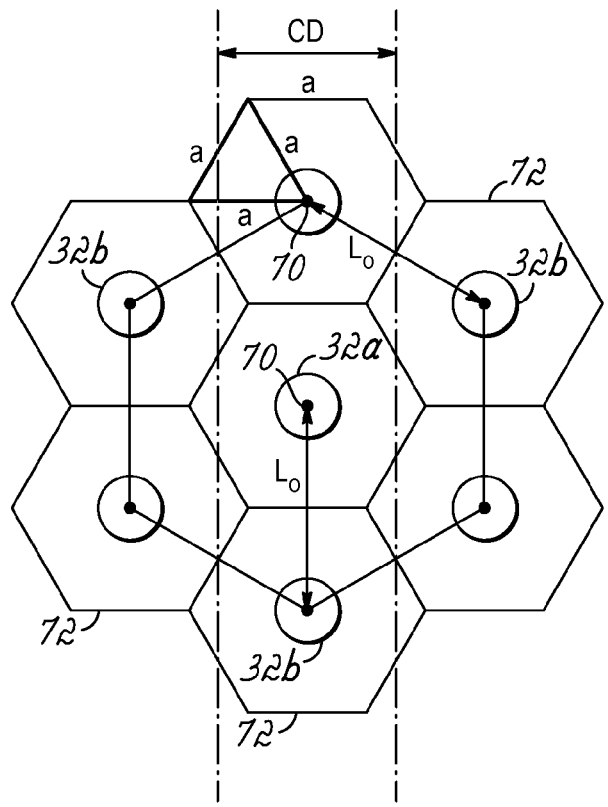
FIG. 8 schematically depicts the dimensional considerations for the morphology of FIG. 6 in the case of preferential wetting by the majority phase of the BCP.

In the context of using a trench template to guide the assembly of the structure, two cases are considered. In each case, a common BCP is used as an example, namely poly(styrene)-b-poly(methyl methacrylate) (PS/PMMA) where PMMA is the minority cylindrical-forming phase. In the first case, the walls of the template will be preferential to the minority phase that will form the BCP cylinder, i.e., preferentially wetting to the PMMA phase. In the second case, the walls of the template will be preferential to the majority phase that will form the matrix, i.e., preferentially wetting to the PS phase. FIG. 7 provides the dimensional considerations for the first case, and FIG. 8 provides the dimensional considerations for the second case.

The critical dimension (CD) of the trench template will dictate how tightly the via arrays are packed. In the first case, the ideal way to have the trench mimic the HCP structure is for the PMMA-wetted walls to be placed to correspond to the center of the adjacent holes in the HCP array. The trench CD in this case is 3a+the distance of 2 PMMA wetting layers. Converting this dimension in terms of $L_o$ would give you the CD of the trench equal to the square root of 3 times $L_o$+the distance of the 2 PMMA wetting layers.

In the second case, the ideal way to have the trench mimic the HCP structure is a zig-zag shaped trench. Since creation of such a structure is highly improbable, the simplest approximation is to draw a trench of uniform width that has the same average width as the zig-zag trench. Again, by geometry, this trench is 3/2 of a, or the square root of 3 divided by two times $L_o$ (e.g., $\sqrt{3}/2 \times L_o$). Note also that there is no additional space required by the wetting layer since the majority phase is wetting the wall of the trench. The trench required by this implementation is significantly narrower than the trench in the first case.

Figure 9:
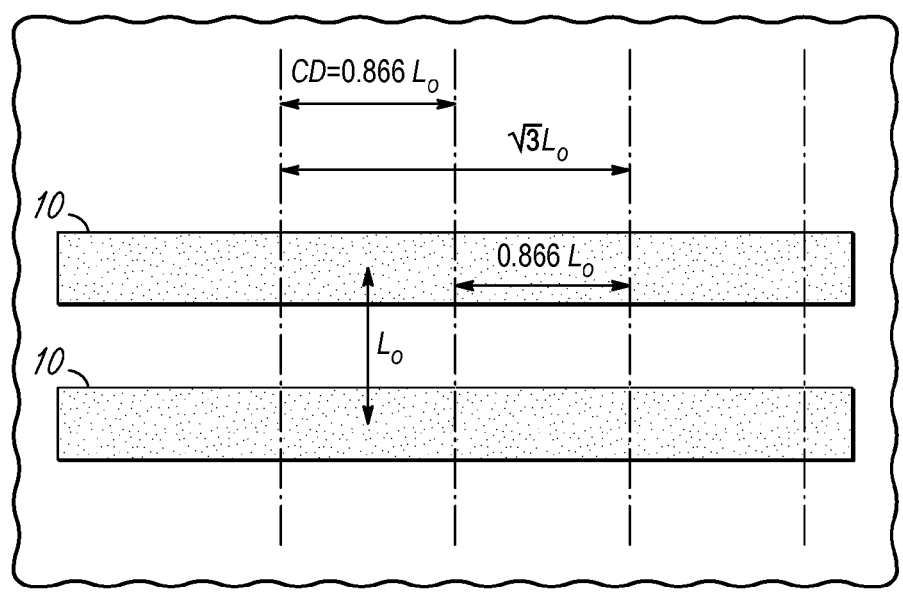
FIG. 9 schematically depicts the layout of a pattern where the $L_o$ of the BCP matches the pitch of the lines in the majority phase wetted case.

In the case of the majority-phase wetted trench, to get a dense packing of the holes (and thus the densest density of cuts), an integration is completed that follows a litho/etch/DSA/litho/etch/DSA flow. In terms of the layout of the DSA patterns, as shown schematically in FIG. 9, the $L_o$ of the BCP must approximately match the pitch of the lines 10 that are to be cut, for example, the distance (center to center) between the lines is between $0.9L_o$ and $1.1L_o$, and ideally equal to $L_o$, and this factor defines the tightest pitch that can be achieved in the y-direction. As discussed above, if the pitch of the lines does not exactly match $L_o$, the self-assembly will nonetheless align the BCP cylinders to the lines due to the DSA pattern being formed immediately overlying the lines to be cut, thus allowing for the $0.9L_o$-$1.1L_o$ range. The CD of the trench, which guides the formation of the holes, is less than or equal to the $L_o$ of the BCP and greater than a diameter, d, of the holes that are being created from the minority cylindrical phase (e.g., $d<CD \leq L_o$). According to the geometrical approximation given above, the CD of the trench, i.e., the trench width, is one half the square root of 3 times the polymer $L_o$ (e.g., $\sqrt{3}/2 \times L_o$), or $0.866L_o$. Taking into account material variations, the trench width is between $0.7 L_o$ and $1.0 L_o$, with the statistical average being $0.866 L_o$. Each lithographic pass may form a set of trenches spaced apart across the lines, not just the single trench depicted in FIG. 4. Since the process flow includes two passes, enough space must be left between the first set of trenches for the second set of trenches to be patterned. One option is for the spaces between the first set of trenches to equal the trench CD such that the second set of trenches of the same trench CD fit perfectly between the first set of trenches with no overlap, as shown in FIG. 9. However, in accordance with another embodiment of the invention, some of the space occupied by the two sets of trenches may be shared by the two sets of trenches, creating an overlap between the trenches of the two DSA patterns. Rather than the second trenches fitting perfectly between the first trenches with no overlap, the second trenches may fit perfectly between the first holes by sharing space between the holes.

Figure 10:
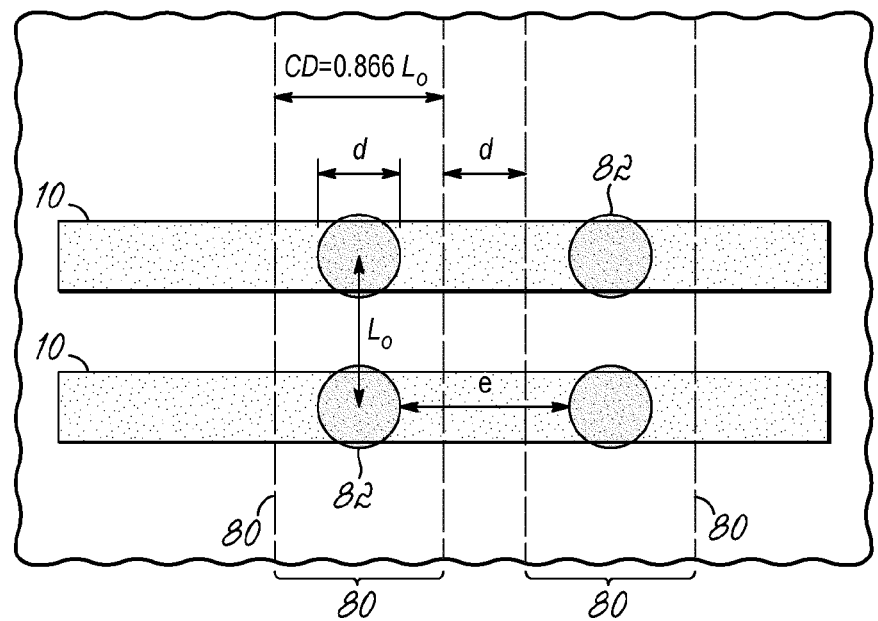
FIG. 10 schematically depicts how the holes would form in a variation of the layout of FIG. 9 after a first DSA pass.

To illustrate, FIG. 10 shows completion of the first lithographic pass. As described above, and using the statistical averages, the trench width of a first set of trenches 80 to guide the formation of a first set of holes 82 is $0.866 L_o$. At the maximum packing density, the spacing between the trenches 80 is equal to the diameter, d, of the holes 82 that are being created so that there will be appropriate space for the creation of another set of holes in a second pass without having that second guide trench encroach upon the holes 82 created in the first pass. The distance, e, which is measured from one edge of one hole 82 to the closest edge of the adjacent hole 82 is equal to the sum of d+CD−d=CD.

Figure 11:
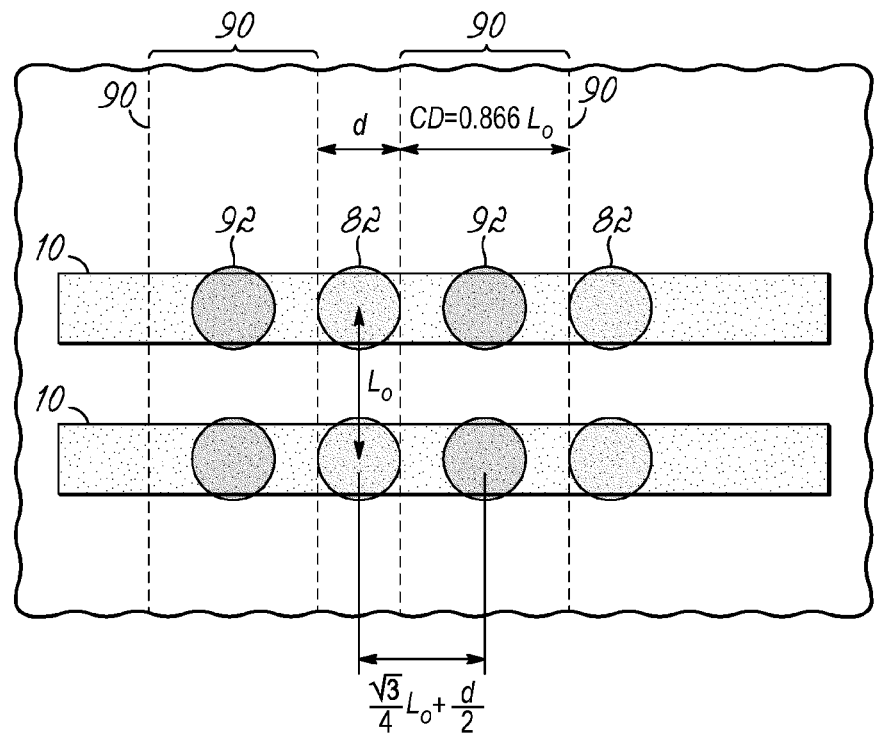
FIG. 11 schematically depicts the result of a second DSA pass resulting from a second trench lithography with the trenches perfectly placed between the holes created by the first DSA pass.

In a second pass, shown in FIG. 11, a second set of trenches 90 is placed to guide the formation of a second set of holes 92. There is just enough room between adjacent holes 82 to place a guiding trench 90 of CD=0.866 $L_o$ and have the resist pattern cover and protect the first set of holes 82, as demonstrated in FIG. 11. Geometric calculations show that the center to center distance between the holes 82 and 92 in the two passes is the sum of one fourth of the square root of 3 times the polymer $L_o$ and one half of the hole diameter (e.g., $\sqrt{3}/4 \times L_o + d/2$).

Figure 12:
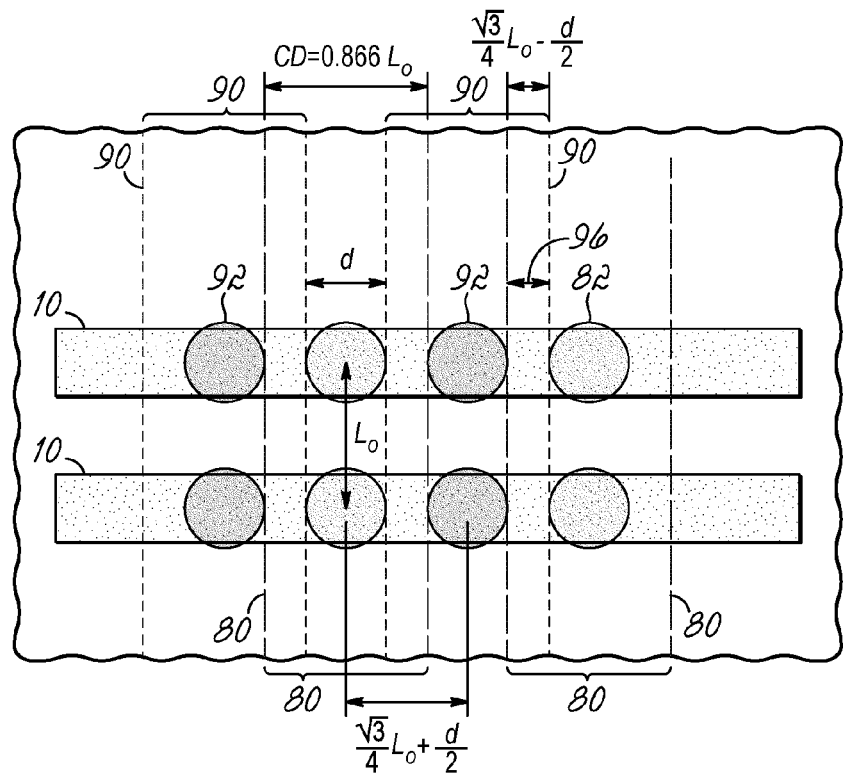
FIG. 12 schematically depicts a composite of the two DSA passes of FIGS. 10 and 11 to illustrate the overlap in the positions of the trenches of the first and second passes.

FIG. 12 illustrates a composite of the two lithographic passes of FIGS. 10 and 11 to clarify the geometric considerations. From FIG. 12, it is clear how the guide trenches 80, 90 for the holes 82, 92 allow just enough room for the other lithographic pass. The width of the area 96 that is shared by both of the lithographic trenches 80, 90 is equal the spacing difference between adjacent holes of the first and second passes, which according to the geometrical approximation given above is given by the difference of one fourth of the square root of three times the polymer $L_o$ and one half of the hole diameter (e.g., $\sqrt{3}/4 \times L_o - d/2$).

Figure 13:
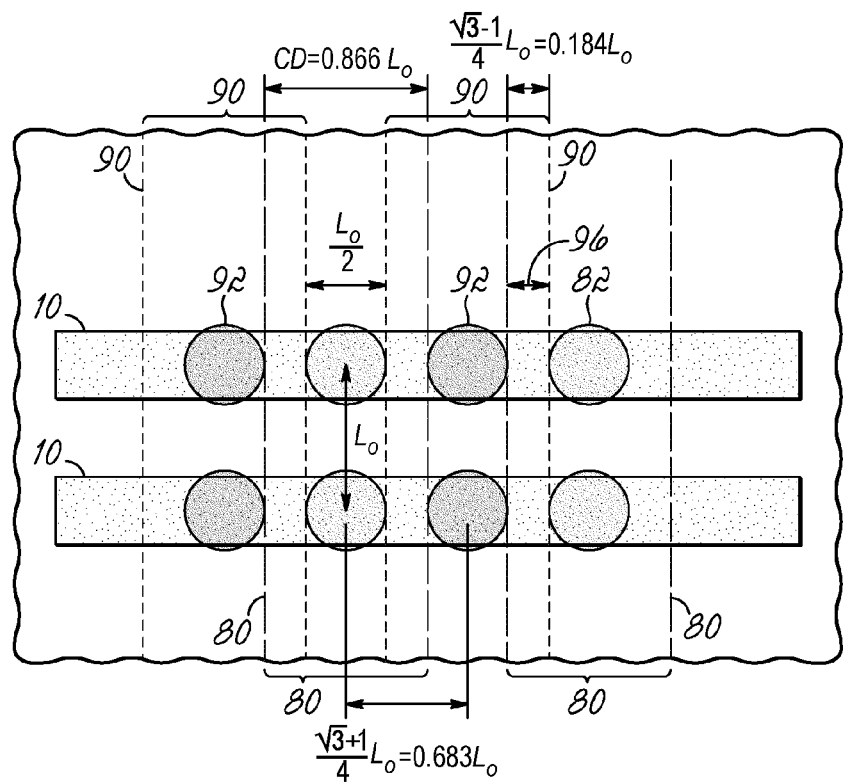
FIG. 13 is similar to FIG. 12 and further provides dimensional details.

As illustrated in FIG. 13, for many block copolymers, the diameter, d, of the cylindrical phase is one half of the block copolymer $L_o$ (e.g., $d = L_o/2 = 0.5 L_o$). In this case, the spacing between the trenches 80 of the first pass or between the trenches 90 of the second pass is given by diameter, d, or one half of the block copolymer $L_o$. The center to center distance of the most tightly packed array, i.e., the spacing between the line cuts, is then given by one fourth the sum of the square root of three and one, times the block copolymer $L_o$ (e.g., $(\sqrt{3}+1)/4 \times L_o$), or 0.683 $L_o$. The width of the area 96 shared by both of the trench patterns is given by one fourth the difference of the square root of three and one, times the block copolymer $L_o$ (e.g., $(\sqrt{3}-1)/4 \times L_o$), or 0.184 $L_o$. Taking into account material variations, where each template is favorable (e.g., preferential) to wetting by a majority phase of the block copolymer, and the block copolymer has a HCP morphology, the width of the trenches of each pass, i.e., of the template for each pass, is between 0.7 $L_o$ and 1.0 $L_o$, with the statistical average being 0.866 $L_o$, and as a result of overlapping the position of the trenches, the density of the cuts between the first and second passes, i.e., the center to center distance of the most tightly packed array, is between 0.55 $L_o$ and 0.8 $L_o$, with the statistical average being 0.683 $L_o$. Thus, the tightest grid that can be created in this case is roughly 0.683 $L_o \times L_o$. Without the overlap, the tightest packing, on average, is 0.866 $L_o$, with the tightest grid that can be created being roughly 0.866 $L_o \times L_o$.

Figure 14:
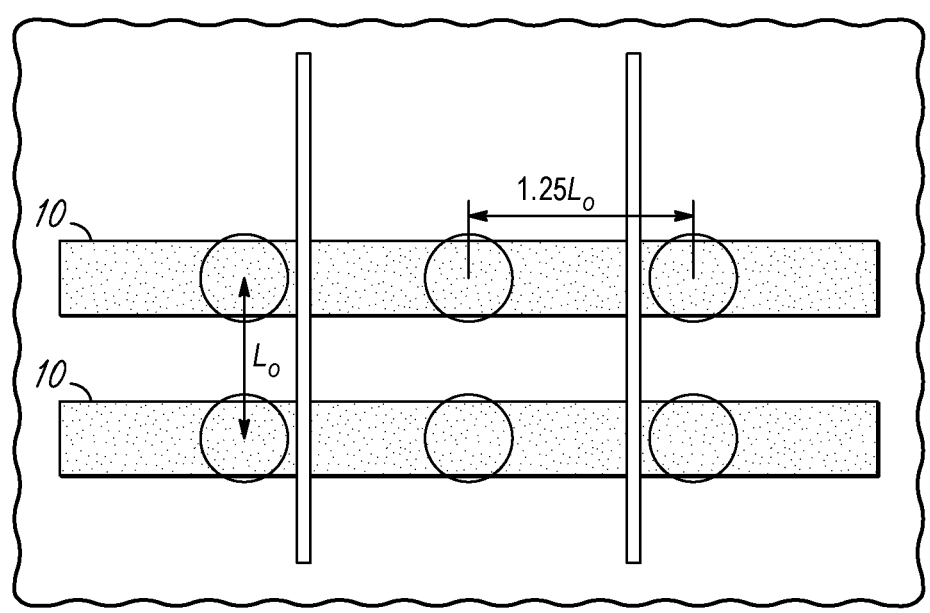
FIG. 14 schematically depicts the result of a two DSA pass process for the minority phase wetted case.

In the case where a minority-phase wetted trench is used instead of majority phase wetted trench, as derived previously, the CD of the trench required to drive optimal assembly is the square root of 3 times $L_o$+the width of two minority phase wetting layers. For representative dimensions, this leads to an approximate value of $2L_o$ for the CD of the guiding trench. Completing an analysis similar to that completed above, it is found that the tightest grid that can be created in this case is roughly 1.25 $L_o \times L_o$. This is illustrated in FIG. 14. The trench from the second pass is required to be $2L_o$ and it must not uncover either of the holes created in the first pass, and so that defines the spacing between the holes of the first pattern. If the holes are again $L_o/2$ in dimension (in reality, they will be smaller than in the majority-wetting case because a partial volume of the minority phase will wet the wall of the trench, but the $L_o/2$ rule of thumb will still be used), then the pitch between the first holes is 2.5 $L_o$ making the two-pass pitch 1.25 $L_o$.

Figure 15A:
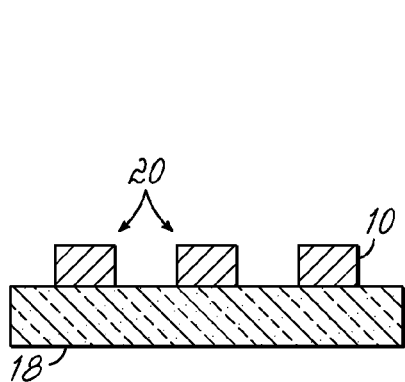
FIGS. 15A-15M depict in schematic cross-sectional view an embodiment of a method for patterning lines using directed self-assembly in accordance with the invention.
Figure 15B:
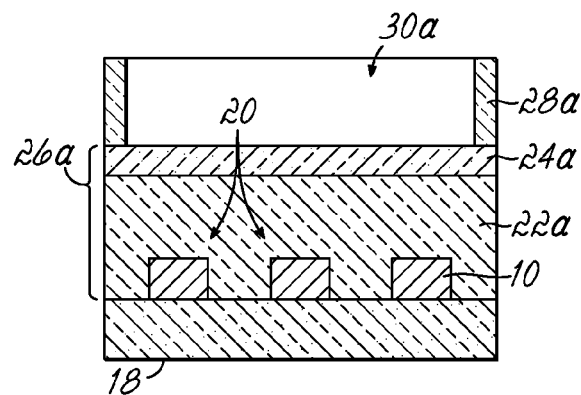
Figure 15C:
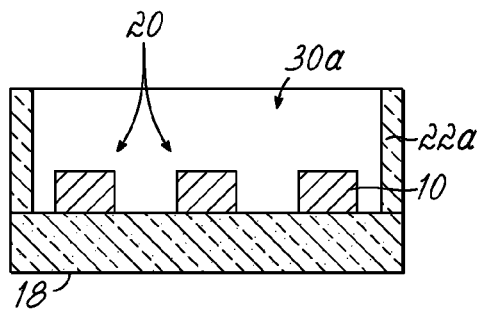

To make the layout schematics above into a real structure on a wafer, the process flow of FIGS. 15A-15M may be followed. In FIG. 15A, a line array or topography 20 is formed with a pitch $L_o$ between lines 10. In FIG. 15B, a first dual-layer BARC 26a is formed, including a first planarization layer 22a and first ARC layer 24a, and a first radiation-sensitive material layer 28a, e.g., photoresist, is applied thereon and patterned with a first plurality of trench templates 30a orthogonal to the lines 10, with each template CD being $\sqrt{3}/2 \times L_o$ (=0.866 $L_o$) and the space between templates either being $\sqrt{3}/2 \times L_o$ (=0.866 $L_o$), in the case of no overlap between the sets of trenches, or $L_o/2$, in the case of overlapping trenches. As shown in FIG. 15C, the pattern is then transferred to the first planarization layer 22a.

Figure 15D:
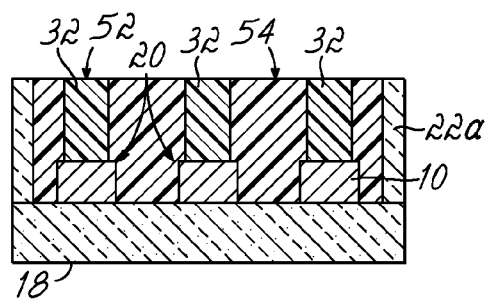

As shown in FIG. 15D, a first DSA pass is then conducted. This includes filling the trench templates 30a with a BCP 50 and then annealing to cause the minority phase of the BCP to form a first plurality of cylinders 32a aligned over the lines 10 within a matrix of the majority phase of the BCP. The cylinders 32a have a CD of $L_o/2$. Optionally, the sidewalls of the trench templates 30a may be brush coated with the majority phase of the BCP, e.g., with a PS-OH polymer, to make the sidewalls attractive to the majority phase, though the brush coating may require a slight adjustment to the dimensions of the initial trench template pattern. Alternatively, the templates 30a may be subjected to other chemical treatments to alter a surface property thereof, for example, to render the sidewalls less attractive to the minority phase of the BCP and/or to render the topography more attractive to the minority phase.

Figure 15E:
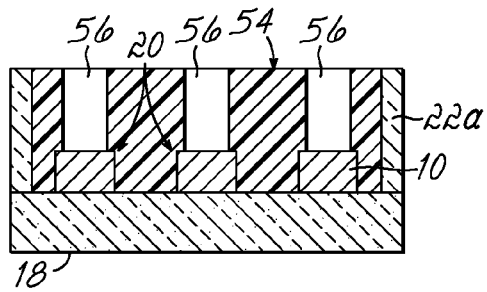
Figure 15F:
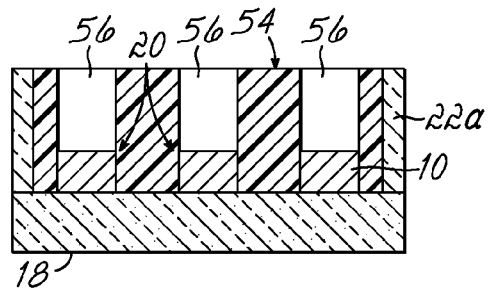
Figure 15G:
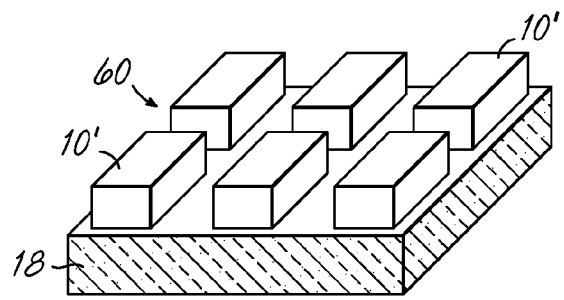

As shown in FIG. 15E, the BCP 50 is then developed to remove the cylindrical morphology thereby exposing a first DSA pattern immediately overlying the topography 20. Optionally, as shown in FIG. 15F, an etching step may be performed to increase the CD of the holes of the DSA pattern to greater than $L_o/2$, up to the CD of the lines 10, or even greater. The first DSA pattern is then transferred into the topography 20 to cut the lines 10. The remaining BCP 50 and first planarization layer 22a are stripped after the lines 10 are cut, leaving the topography 20 as an array 60 of cut lines 10', as shown in FIG. 15G.

Figure 15H:
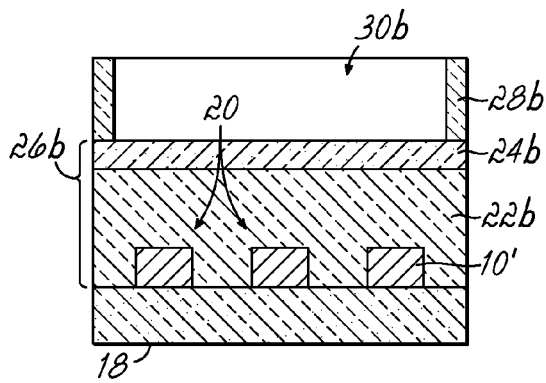
Figure 15I:
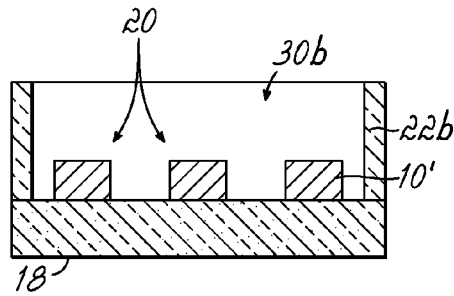

The steps are then repeated for a second DSA pattern. In FIG. 15H, a second dual-layer BARC 26b is formed, including second planarization layer 22b and second ARC layer 24b, and a second radiation-sensitive material layer 28b, e.g., photoresist, is applied thereon and patterned with a second plurality of trench templates 30b orthogonal to the lines 10', with each template CD being $\sqrt{3}/2 \times L_o$ (=0.866 $L_o$) and the space between templates either being $\sqrt{3}/2 \times L_o$ (=0.866 $L_o$), in the case of no overlap between the sets of trenches, or $L_o/2$, in the case of overlapping trenches. The trench templates 30b are offset 0.866 $L_o$ from the location where the trench templates 30a were positioned, in the case of no overlap, or are offset 0.683 $L_o$ in the case of overlapping trenches, such that the trench templates 30b are positioned between the cuts in the lines 10'. As shown in FIG. 15I, the pattern is then transferred to the second planarization layer 22b.

Figure 15J:
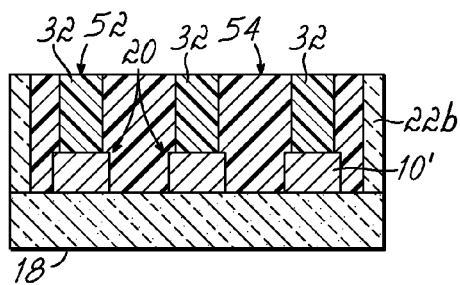

As shown in FIG. 15J, a second DSA pass is then conducted. This includes filling the trench templates 30b with a BCP 50 and then annealing to cause the minority phase of the BCP to form a second plurality of cylinders 32b aligned over the lines 10' within a matrix of the majority phase of the BCP. The cylinders 32b have a CD of $L_o/2$. Optionally, the sidewalls of the trench templates 30 may be brush coated with the majority phase of the BCP, e.g., with a PS-OH polymer, to make the sidewalls attractive to the majority phase, though the brush coating may require a slight adjustment to the dimensions of the initial trench template pattern. Alternatively, the templates 30b may be subjected to other chemical treatments to alter a surface property thereof, for example, to render the sidewalls less attractive to the minority phase of the BCP and/or to render the topography more attractive to the minority phase.

Figure 15K:
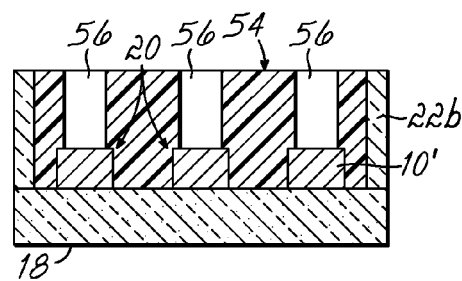
Figure 15L:
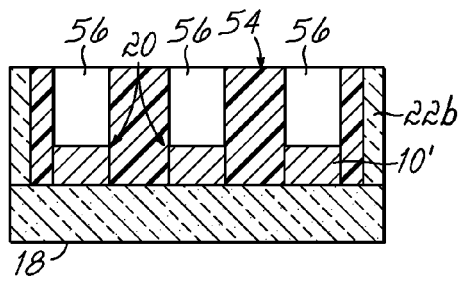
Figure 15M:
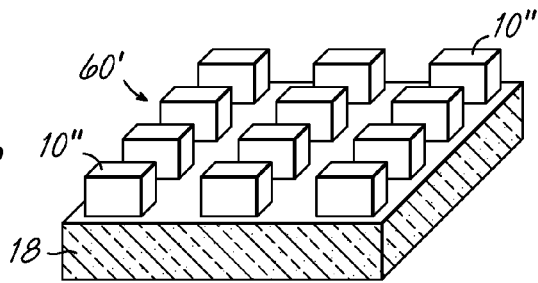

As shown in FIG. 15K, the BCP 50 is then developed to remove the cylindrical morphology thereby exposing a second DSA pattern immediately overlying the topography 20. Optionally, as shown in FIG. 15L, an etching step may be performed to increase the CD of the holes of the DSA pattern to greater than $L_o/2$, up to the CD of the lines 10', or even greater. The second DSA pattern is then transferred into the topography 20 to cut the lines 10' a second time. The remaining BCP 50 and second planarization layer 22b are stripped after the lines 10' are cut, leaving the topography 20 as an array 60' of cut lines 10", as shown in FIG. 15M.

Further regarding the optional steps of FIGS. 15F and 15L, the etch is designed to make the holes slightly larger than they are with DSA by itself so that they will be larger in size than the lines (assuming the lines are at half of the pitch) If the lines are indeed less than half the pitch, then these steps might not be necessary. Alternatively, if a BCP with a higher volume fraction of the minority phase is used (but still remains in the cylinder-forming part of the phase diagram), then the holes may be larger and may not require these steps.

In order to achieve ultra-high density of cuts, the majority phase should wet the wall of the trench template. In a PS-PMMA BCP, one embodiment for achieving a PS-wetting template sidewall is to coat the trench with a PS-OH brush material. This material will slightly change the CD of the patterned trench, and so the trench would need to be made larger initially (slightly larger than $\sqrt{3}/2 \times L_o$) to accommodate the extra mass. The resulting trench after treatment would then be at the critical trench CD.

The present invention contemplates the use of various methods of forming the trench templates, including traditional lithography, sidewall spacer processes, or a combination of traditional lithography with shrink techniques for making smaller trenches, such as growing ALD collars or materials such as RELACS or SAFIER that are known to shrink trenches in photoresist. The shrunken trench could then be transferred into the underlying planarization layer (SOC layer) that would serve as the grapho-epitaxial template. The initial trenches could also be shrunken through the use of etch techniques known to reduce trench CDs.

In the end, the creation of such a tightly packed array of line cuts allows for the creation of a very dense array of patterned islands which can be useful in a variety of different applications.

While specific values have been provided herein, it may be appreciated that the invention is not so limited. For example, when the trench template is favorable (e.g., preferential) to wetting by a minority phase of the BCP, and the BCP has a hexagonal close-packed (HCP) morphology, the width of the template may be between 1.5 and 2.0 times a characteristic dimension $L_o$ of the BCP (e.g., $1.5L_o$-$2.0L_o$) plus two thicknesses of a wetting layer formed by the minority phase of the BCP on sidewalls of the template. By way of further example, the width of the template may be 1.73 times the characteristic dimension $L_o$ of the BCP (e.g., $1.73L_o$) plus two thicknesses of the wetting layer. Further, the spacing between the first set of line cuts and the second set of line cuts may be between 1 and 1.5 times the characteristic dimension $L_o$ of the BCP (e.g., $1.0L_o$-$1.5L_o$), for example between 1.2 and 1.3 times the $L_o$ (e.g., $1.2L_o$-$1.3L_o$), and by further example, 1.25 times the $L_o$ (e.g., $1.25L_o$).

Alternatively, when the trench template is favorable (e.g., preferential) to wetting by a majority phase of the BCP, and the BCP has a hexagonal close-packed (HCP) morphology, the width of the template may be between 0.7 and 1.0 times a characteristic dimension $L_o$ of the BCP (e.g., $0.7L_o$-$1.0L_o$). By way of further example, the width of the template may be 0.866 times the characteristic dimension $L_o$ of the BCP (e.g., $0.866L_o$), and the trench positions may overlap between passes. Further, with such overlapping trench positions, the spacing between the first set of line cuts and the second set of line cuts may be between 0.55 and 0.8 times the characteristic dimension $L_o$ of the BCP (e.g., $0.55L_o$-$0.8L_o$), for example between 0.6 and 7 times the $L_o$ (e.g., $0.6L_o$-$0.7L_o$), and by further example, 0.683 times the $L_o$ (e.g., $0.683L_o$).

In addition, a BCP may be selected for the present invention having a hexagonal close-packed (HCP) morphology and a characteristic dimension $L_o$ that is between 0.9 and 1.1 times the desired spacing between individual lines of the plurality of lines, and most advantageously, a characteristic dimension $L_o$ that is equal to the desired spacing between individual lines of the plurality of lines.

Figure 16A:
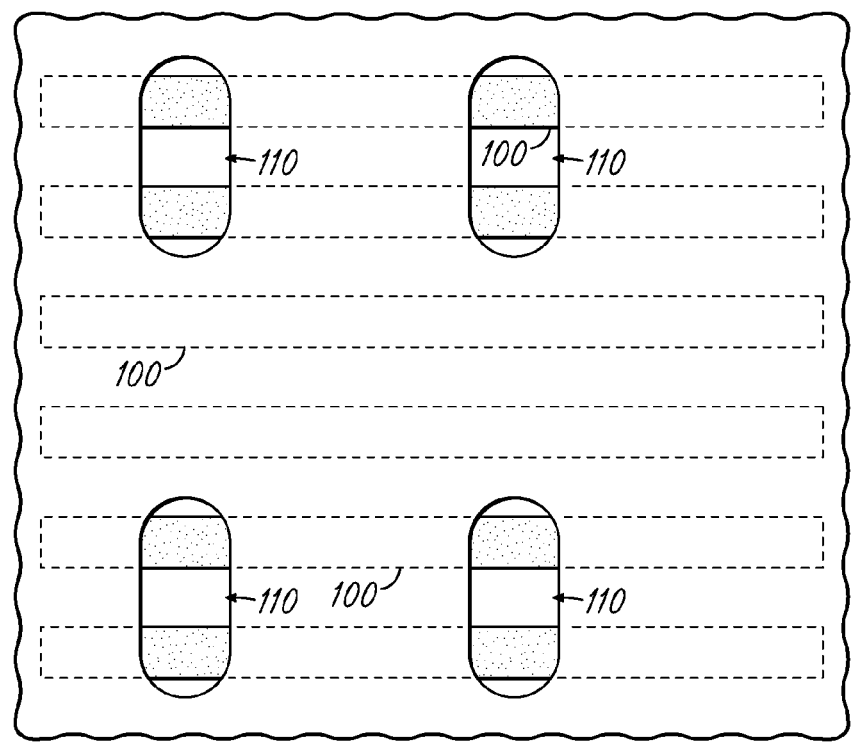
FIGS. 16A-16F depict in top schematic view a litho/etch/DSA/litho/etch/DSA flow for creating a design of line features.
Figure 16B:
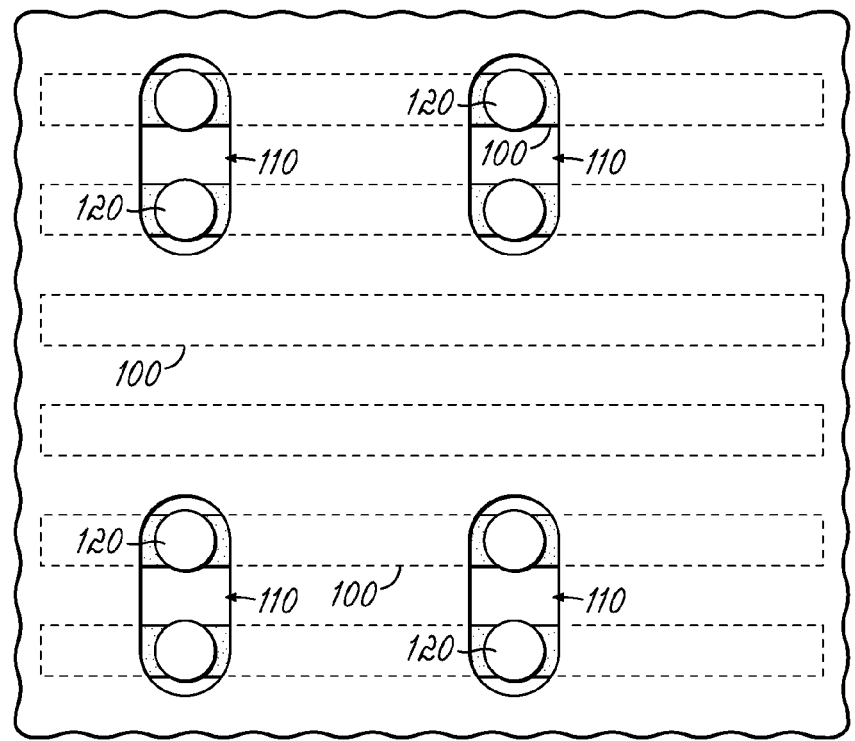
Figure 16C:
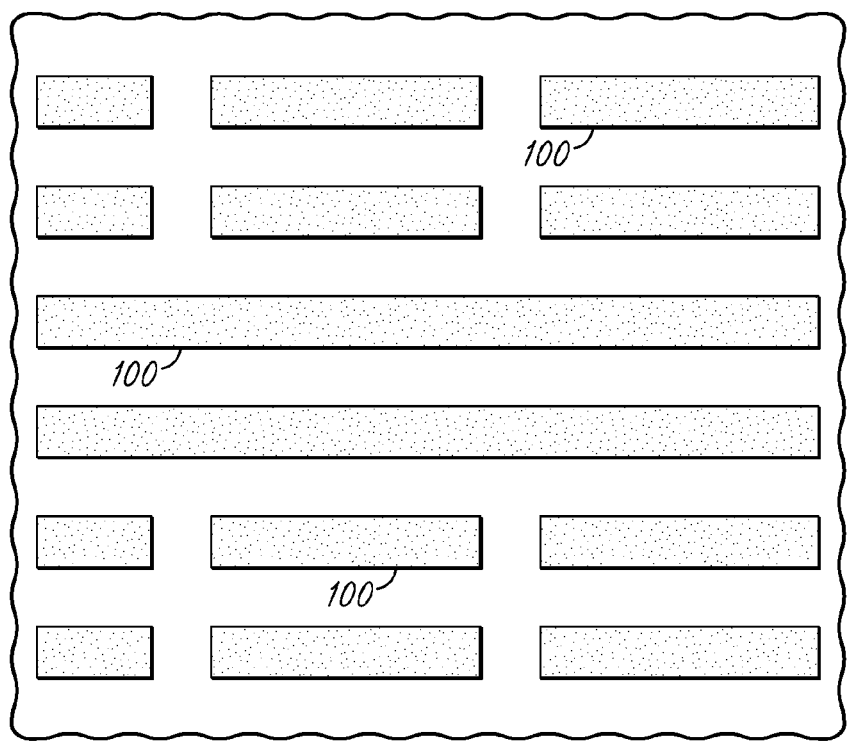
Figure 16D:
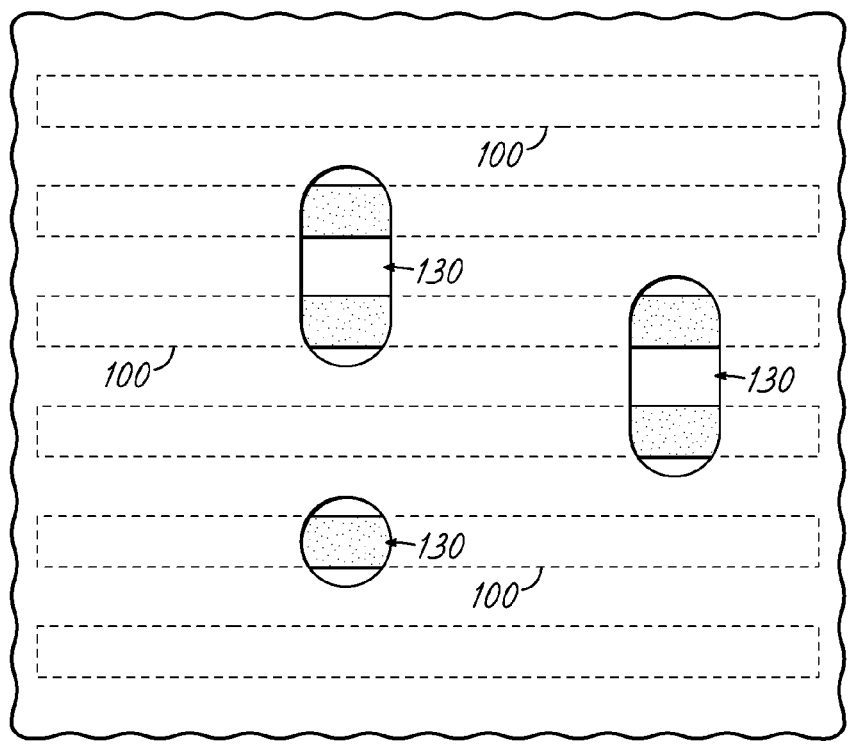
Figure 16E:
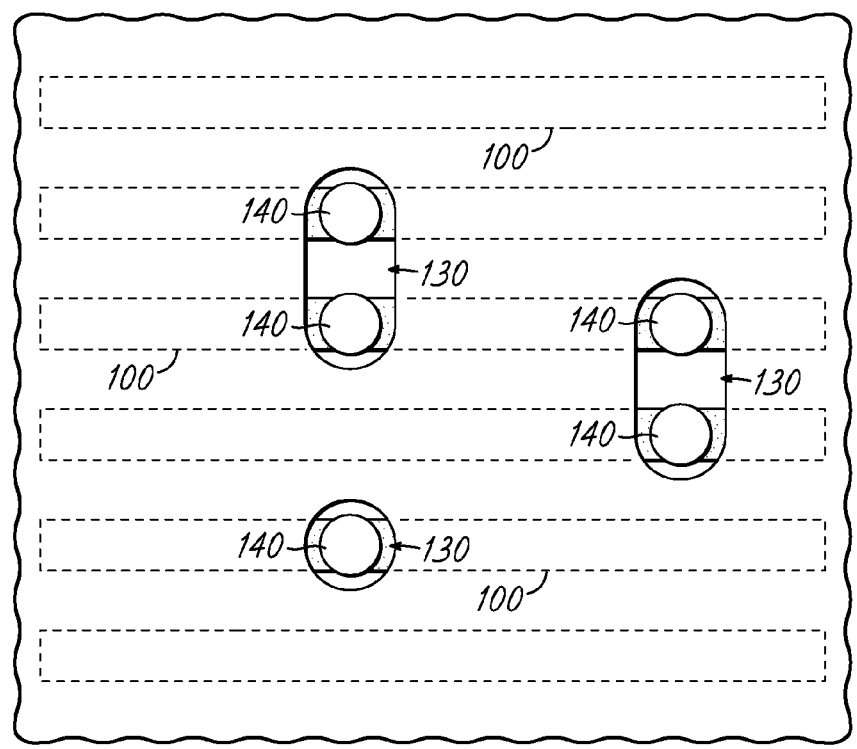
Figure 16F:
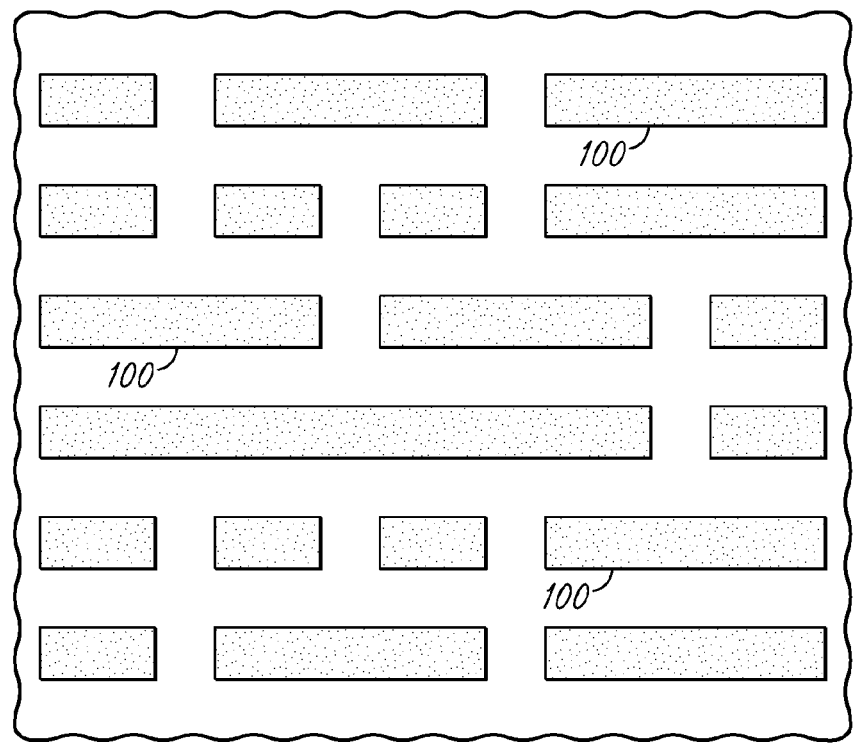

The technique highlighted above can also be modified in a number of ways to make it compatible with logic, memory or other line designs. For example, to make the pattern of FIG. 16F, a litho/etch/DSA/litho/etch/DSA flow can be used to cut the lines 100, as shown in FIGS. 16A-16E. In FIG. 16A, a first set of templates 110 is formed, followed by a first DSA in FIG. 16B to form cylinders 120 in the templates 110. The trench lengths may be shorter since the first DSA pattern will only be used to cut some of the lines. The first DSA pattern is then developed and transferred into the lines 100 to make a portion of the line cuts as shown in FIG. 16C. A second set of templates 130 is then formed, as shown in FIG. 16D, followed by a second DSA in FIG. 16E to form cylinders 140 in the templates 130. The second DSA pattern is then developed and transferred into the lines 100 to make the remaining portion of the line cuts as shown in FIG. 16F.

In the embodiment of FIGS. 15A-15M where the process was designed to create the densest possible array of islands, the nearly infinite trenches were patterned as two populations with trenches within each population (pass) separated by a minimum distance ($\sqrt{3}/2 \times L_o$ or $L_o/2$). That scheme may be viewed in a more simplified way as: (1) Pattern population A of trenches, (2) Transfer Population A, (3) Offset Pattern by desired amount, and pattern population B of trenches, and (4) Transfer Population B. In the line pattern approach of FIG. 16A-16F, instead of having only nearly infinite trenches in Populations A and B, the infinite trenches are decomposed into shorter trenches (or holes) and placed in the same tracks that the infinite trenches occupied. One benefit of the shorter trenches relates to surface interactions. In simulations, it was found that the interaction with the sidewall and the topography is a much stronger influence than with the bottom substrate. Therefore, for these shorter trench structures, footing that occurs due to pattern resolution issues can be mitigated by correctly tailoring the topographic interaction with the photoresist so that the BCP is agnostic to this footing. Likewise, if the tethering topography is correctly created, misalignment in the graphical pattern can also be corrected.

While the present invention has been illustrated by a description of one or more embodiments thereof and while these embodiments have been described in considerable detail, they are not intended to restrict or in any way limit the scope of the appended claims to such detail. Additional alternatives, advantages and/or modifications will readily appear to those skilled in the art. For example, it may be possible to control the template topography and surfaces so that the cylinders land between the lines instead of on top of them. The invention in its broader aspects is therefore not limited to the specific details, representative apparatus and method, and illustrative examples shown and described. Accordingly, departures may be made from such details without departing from the scope of the general inventive concept.

What is claimed is:

1. A method for forming a patterned topography on a substrate, comprising:
   providing a substrate with an exposed plurality of lines formed atop;
   aligning and preparing a first directed self-assembly (DSA) pattern immediately overlying the plurality of lines, the first DSA pattern including a first set of trenches of a first trench width and a first set of holes of diameter d;
   transferring the first set of holes of the first DSA pattern to form a first set of cuts in the plurality of lines;
   aligning and preparing a second DSA pattern immediately overlying the plurality of lines having the first set of cuts formed therein, the second DSA pattern including a second set of trenches of a second trench width and a second set of holes of diameter d; and
   transferring the second set of holes of the second DSA pattern to form a second set of cuts in the plurality of lines,
   wherein the first and second DSA patterns each comprise a block copolymer having a hexagonal close-packed (HCP) morphology, a characteristic dimension $L_o$ that is approximately equal to the spacing between individual lines of the plurality of lines, and a minority cylindrical phase of the diameter d;
   wherein the first and second sets of trenches are preferential to wetting by a majority phase of the block copolymer and guide formation of the first and second sets of holes, respectively, from the minority cylindrical phase;
   wherein the first and second trench widths are less than or equal to the $L_o$ and greater than diameter d, wherein the distance between trenches of the first set of trenches and between trenches of the second set of trenches is approximately equal to the diameter d, and wherein the distance between edges of adjacent holes in the first set of holes and between edges of adjacent holes in the second set of holes is approximately equal to the first and second trench widths, respectively; and
   wherein aligning and preparing the second DSA pattern includes overlapping a position of the second set of trenches with a position of the first set of trenches such that areas between holes of the first set of holes and adjacent holes of the second set of holes are shared by adjacent trenches of the first and second sets of trenches.

2. The method of claim 1, wherein the diameter d is approximately $0.5L_o$.

3. The method of claim 1, wherein the first and second trench widths are between $0.7L_o$ and $1.0L_o$.

4. The method of claim 1, wherein the first and second trench widths are approximately $0.866L_o$.

5. The method of claim 1, wherein the spacing between the first set of line cuts and the second set of line cuts is between $0.55L_o$ and $0.8L_o$.

6. The method of claim 1, wherein the spacing between the first set of line cuts and the second set of line cuts is approximately $0.683L_o$.

7. The method of claim 1, wherein the width of the areas that are shared by adjacent trenches of the first and second sets of trenches is the difference of one fourth of the square root of three times the polymer $L_o$ and one half of the hole diameter.

8. The method of claim 1, wherein the width of the areas that are shared by adjacent trenches of the first and second sets of trenches is $0.184L_o$.

9. The method of claim 1, wherein the aligning and preparing the first and second DSA patterns include forming the first and second sets of trenches to surround the exposed plurality of lines, surface treating sidewalls of the first and second sets of trenches to render the sidewalls preferential to wetting by the majority phase of the block copolymer, and thereafter filling the first and second sets of trenches with the block copolymer (BCP) to cover the exposed line portions.

10. The method of claim 1, wherein the aligning and preparing the first and second DSA patterns each include:
    applying a planarization layer on the exposed plurality of lines;
    applying an antireflective layer over the planarization layer;
    applying a layer of radiation-sensitive material over the antireflective layer;
    patterning the layer of radiation-sensitive material to form a radiation-sensitive material pattern;
    transferring the radiation-sensitive material pattern into the planarization layer by etching the antireflective layer and planarization layer to partially expose the plurality of lines, the exposed portions of the plurality of lines forming exposed line portions;
    stripping any remaining portions of the radiation-sensitive material pattern and the antireflective layer to leave the exposed line portions surrounded by the first and second set of trenches, respectively;
    surface treating sidewalls of the first and second sets of trenches to render the sidewalls preferential to wetting by the majority phase of the block copolymer;
    filling the first and second sets of trenches, respectively with the block copolymer to cover the exposed line portions;
    annealing the block copolymer to drive self-assembly in alignment with the exposed line portions;
    developing the annealed block copolymer to expose the first and second DSA patterns, respectively, immediately overlying the exposed line portions.

11. A method for forming a patterned topography on a substrate, comprising:
    providing a substrate with an exposed plurality of lines formed atop;
    aligning and preparing a first directed self-assembly (DSA) pattern immediately overlying the plurality of lines, the first DSA pattern including a first set of trenches of a first trench width and a first set of holes of diameter d;
    transferring the first set of holes of the first DSA pattern to form a first set of cuts in the plurality of lines;
    aligning and preparing a second DSA pattern immediately overlying the plurality of lines having the first set of cuts formed therein, the second DSA pattern including a second set of trenches of a second trench width and a second set of holes of diameter d; and transferring the second set of holes of the second DSA pattern to form a second set of cuts in the plurality of lines, wherein the first and second DSA patterns each comprise a block copolymer having a hexagonal close-packed (HCP) morphology, a characteristic dimension $L_o$ that is between 0.9 and 1.1 times the spacing between individual lines of the plurality of lines, and a minority cylindrical phase of the diameter d, wherein diameter d is approximately $0.5L_o$;

wherein the first and second sets of trenches are preferential to wetting by a majority phase of the block copolymer and guide formation of the first and second sets of holes, respectively, from the minority cylindrical phase;

wherein the first and second trench widths are between $0.7L_o$ and $1.0L_o$, wherein the distance between trenches of the first set of trenches and between trenches of the second set of trenches is approximately equal to the diameter d, and wherein the distance between edges of adjacent holes in the first set of holes and between edges of adjacent holes in the second set of holes is approximately equal to the first and second trench widths, respectively; and wherein aligning and preparing the second DSA pattern includes overlapping a position of the second set of trenches with a position of the first set of trenches such that areas between holes of the first set of holes and adjacent holes of the second set of holes are shared by adjacent trenches of the first and second sets of trenches, and wherein the spacing between the first set of line cuts and the second set of line cuts is between $0.55L_o$ and $0.8L_o$.

12. The method of claim 11, wherein the characteristic dimension $L_o$ is equal to the spacing between individual lines of the plurality of lines.

13. The method of claim 11, wherein the first and second trench widths are approximately $0.866L_o$.

14. The method of claim 11, wherein the spacing between the first set of line cuts and the second set of line cuts is approximately $0.683L_o$.

15. The method of claim 11, wherein the width of the areas that are shared by adjacent trenches of the first and second sets of trenches is $0.184L_o$.

16. The method of claim 11, wherein the characteristic dimension $L_o$ is equal to the spacing between individual lines of the plurality of lines, the first and second trench widths are approximately $0.866L_o$, the spacing between the first set of line cuts and the second set of line cuts is approximately $0.683L_o$, and the width of the areas that are shared by adjacent trenches of the first and second sets of trenches is $0.184L_o$.

17. The method of claim 11, wherein the aligning and preparing the first and second DSA patterns include forming the first and second sets of trenches to surround the exposed plurality of lines, surface treating sidewalls of the first and second sets of trenches to render the sidewalls preferential to wetting by the majority phase of the block copolymer, and thereafter filling the first and second sets of trenches with the block copolymer (BCP) to cover the exposed line portions.

18. The method of claim 11, wherein the aligning and preparing the first and second DSA patterns each include:

applying a planarization layer on the exposed plurality of lines;

applying an antireflective layer over the planarization layer;

applying a layer of radiation-sensitive material over the antireflective layer;

patterning the layer of radiation-sensitive material to form a radiation-sensitive material pattern;

transferring the radiation-sensitive material pattern into the planarization layer by etching the antireflective layer and planarization layer to partially expose the plurality of lines, the exposed portions of the plurality of lines forming exposed line portions;

stripping any remaining portions of the radiation-sensitive material pattern and the antireflective layer to leave the exposed line portions surrounded by the first and second set of trenches, respectively;

surface treating sidewalls of the first and second sets of trenches to render the sidewalls preferential to wetting by the majority phase of the block copolymer;

filling the first and second sets of trenches, respectively with the block copolymer to cover the exposed line portions;

annealing the block copolymer to drive self-assembly in alignment with the exposed line portions;

developing the annealed block copolymer to expose the first and second DSA patterns, respectively, immediately overlying the exposed line portions.

* * * * *